US011422464B2

(12) United States Patent
Konoshima et al.

(10) Patent No.: US 11,422,464 B2
(45) Date of Patent: Aug. 23, 2022

(54) PHOTOSENSITIVE RESIN COMPOSITION, METHOD OF PRODUCING ELECTRICALLY CONDUCTIVE PATTERN, SUBSTRATE, TOUCH PANEL, AND DISPLAY

(71) Applicant: Toray Industries, Inc., Tokyo (JP)

(72) Inventors: Yohei Konoshima, Otsu (JP); Mitsuhito Suwa, Otsu (JP); Yuka Yamashiki, Otsu (JP)

(73) Assignee: Toray Industries, Inc., Tokyo (JP)

( * ) Notice: Subject to any disclaimer, the term of this patent is extended or adjusted under 35 U.S.C. 154(b) by 422 days.

(21) Appl. No.: 16/336,940

(22) PCT Filed: Jul. 6, 2017

(86) PCT No.: PCT/JP2017/024787
§ 371 (c)(1),
(2) Date: Mar. 27, 2019

(87) PCT Pub. No.: WO2018/061384
PCT Pub. Date: Apr. 5, 2018

(65) Prior Publication Data
US 2019/0265592 A1    Aug. 29, 2019

(30) Foreign Application Priority Data

Sep. 30, 2016    (JP) .............................. JP2016-193152

(51) Int. Cl.
| *G03F 7/004* | (2006.01) |
| *G03F 7/038* | (2006.01) |
| *G03F 7/039* | (2006.01) |
| *H01B 1/20* | (2006.01) |
| *H01B 13/00* | (2006.01) |
| *H05K 1/09* | (2006.01) |
| *H05K 3/02* | (2006.01) |
| *G06F 3/041* | (2006.01) |
| *H01L 31/0224* | (2006.01) |
| *H05B 33/02* | (2006.01) |
| *H01B 5/14* | (2006.01) |
| *H01B 1/22* | (2006.01) |
| *G03F 7/40* | (2006.01) |
| *H01L 27/146* | (2006.01) |
| *H01L 51/00* | (2006.01) |
| *H01L 51/50* | (2006.01) |

(52) U.S. Cl.
CPC ............ *G03F 7/004* (2013.01); *G03F 7/0042* (2013.01); *G03F 7/0043* (2013.01); *G03F 7/0047* (2013.01); *G03F 7/038* (2013.01); *G03F 7/039* (2013.01); *G03F 7/40* (2013.01); *G06F 3/041* (2013.01); *H01B 1/20* (2013.01); *H01B 1/22* (2013.01); *H01B 5/14* (2013.01); *H01B 13/00* (2013.01); *H01B 13/0036* (2013.01); *H01L 31/0224* (2013.01); *H05B 33/02* (2013.01); *H05K 1/095* (2013.01); *H05K 3/027* (2013.01); *H01L 27/14636* (2013.01); *H01L 27/14683* (2013.01); *H01L 31/022425* (2013.01); *H01L 51/0023* (2013.01); *H01L 51/50* (2013.01); *H05K 2201/0154* (2013.01); *H05K 2201/0224* (2013.01)

(58) Field of Classification Search
None
See application file for complete search history.

(56) References Cited

U.S. PATENT DOCUMENTS

| 2002/0076649 A1* | 6/2002 | Kumon ................. G03F 7/0397 |
| | | 430/323 |
| 2011/0229661 A1* | 9/2011 | Takita .................. G03F 7/0045 |
| | | 430/326 |
| 2016/0216790 A1 | 7/2016 | Ebihara et al. |

FOREIGN PATENT DOCUMENTS

| JP | 2000-199954 A | 7/2000 |
| JP | 2002-082428 A | 3/2002 |
| JP | 2007-138287 A | 6/2007 |
| JP | 2010-134003 A | 6/2010 |
| JP | 2013-101861 A | 5/2013 |
| JP | 2013-196997 A | 9/2013 |
| JP | 2014-142587 A | 8/2014 |
| JP | 2016-001608 A | 1/2016 |
| WO | 2016/158864 A1 | 10/2016 |

OTHER PUBLICATIONS

Translation of JP 2014-197171 A (Year: 2014).*
Translation of JP 2013-196997 A (Year: 2013).*

* cited by examiner

*Primary Examiner* — Katie L. Hammer
(74) *Attorney, Agent, or Firm* — DLA Piper LLP (US)

(57) ABSTRACT

A photosensitive resin composition includes electrically conductive particles (A) whose surfaces are coated with a carbon simple substance and/or a carbon compound; an alkali-soluble resin (B) containing an acid-dissociation group; and a metal chelate compound (C) wherein the metal chelate compound (C) includes at least one selected from the group consisting of Au, Ag, Cu, Cr, Fe, Co, Ni, Bi, Pb, Zn, Pd, Pt, Al, Ti, Zr, W and Mo.

22 Claims, No Drawings

PHOTOSENSITIVE RESIN COMPOSITION, METHOD OF PRODUCING ELECTRICALLY CONDUCTIVE PATTERN, SUBSTRATE, TOUCH PANEL, AND DISPLAY

TECHNICAL FIELD

This disclosure relates to a photosensitive resin composition, a method of producing an electrically conductive pattern, a substrate, a touch panel and a display.

BACKGROUND

With an increasing prevalence of displays having a higher definition and smaller or denser electronic components, there is a growing demand for miniaturization of electronic wiring. To produce an electrically conductive pattern for use in electronic wiring, using a resin composition containing electrically conductive particles, a method is generally used in which a pattern is formed on a base material, and the fabricated base material is then heated to bring the electrically conductive particles into contact with each other, to obtain the electrically conductive pattern. Examples of the method of forming a pattern on a base material include: a screen printing method, an ink jet method, and a photolithography method. Among them, a screen printing method and an ink jet method are not suitable to form a fine pattern, and it is generally thought that a photolithography method is suitable to form a fine pattern.

In the photolithography method, a photosensitive composition is coated on a base material and dried to form a coating film, and then UV light or the like is irradiated thereto through a photomask on which a shape of a fine circuit pattern is drawn, to form exposed portions and unexposed portions on the coating film. Subsequently, the resultant is developed using a developer, to form a fine pattern on the base material. The fabricated base material is then subjected to a conductive treatment, to form a fine, electrically conductive pattern. The photosensitive composition to be used in the photolithography method is prepared using electrically conductive particles, a photosensitizer, a resin and the like, as constituents (JP 2000-199954 A, JP 2014-142587 A, JP 2002-82428 A and JP 2013-101861 A).

Further, to form a super fine pattern having a size of 5 μm or less, it is necessary to use electrically conductive particles having a finer particle size, and to prevent the formation of agglomerated particles. Regarding the particle size of electrically conductive particles, it is essential to use fine particles having a particle size which is sufficiently small with respect to the required width of the wiring to be formed, from the viewpoint of the surface smoothness and the side surface linearity of the resulting pattern. Regarding the prevention of formation of agglomerated particles, it is essential to use particles whose surfaces are coated to obtain the dispersion stability of the electrically conductive particles. As a photosensitive resin composition prepared using surface-coated fine particles having a sufficiently small particle size, as described above, a photosensitive resin composition is known which is prepared using silver fine particles whose surfaces are coated with a carbon simple substance and/or a carbon compound (JP 2013-196997 A and WO 2016/158864).

However, the use of a photosensitive resin composition prepared using silver fine particles whose surfaces are coated with a carbon simple substance and/or a carbon compound is more likely to result in the formation of residues on a substrate, particularly, on a film containing an organic component, during formation of a pattern. Accordingly, a pattern formed using the above described photosensitive resin composition has problems such as poor appearance, low reliability and the like.

It could therefore be helpful to provide a photosensitive resin composition which achieves both a fine pattern resolution and suppression of residues on a substrate, even when the pattern is formed on a film containing an organic component. The use of such a photosensitive resin composition enables to produce a fine, electrically conductive pattern having an extremely good appearance and a high reliability.

SUMMARY

We thus provide a photosensitive resin composition including: electrically conductive particles (A) whose surfaces are coated with a carbon simple substance and/or a carbon compound; an alkali-soluble resin (B) containing an acid-dissociation group; and a metal chelate compound (C).

That is, we provide a photosensitive resin composition including: electrically conductive particles (A) whose surfaces are coated with a carbon simple substance and/or a carbon compound; an alkali-soluble resin (B) containing an acid-dissociation group; and a metal chelate compound (C).

The photosensitive resin composition obtains a fine conductive pattern having a good appearance and a high reliability.

DETAILED DESCRIPTION

The photosensitive resin composition is characterized by including: electrically conductive particles (A) whose surfaces are coated with a carbon simple substance and/or a carbon compound; an alkali-soluble resin (B) containing an acid-dissociation group; and a metal chelate compound (C). The photosensitive resin composition may have a positive type photosensitivity or a negative type photosensitivity, but preferably has a negative type photosensitivity. Electrically Conductive Particles (A) Whose Surfaces Are Coated With Carbon Simple Substance and/or Carbon Compound In the electrically conductive particles (A) whose surfaces are coated with a carbon simple substance and/or a carbon compound, the presence of a layer (hereinafter, referred to as "surface coating layer") coating the surfaces of the conductive particles enables to prevent fusion between electrically conductive particles at a low temperature.

Coating of the particle surface with a carbon simple substance and/or carbon compound may be carried out, for example, by a method in which electrically conductive particles are brought into contact with a reactive gas, when producing the conductive particles by a thermal plasma method (JP 2007-138287 A). Although it is preferred that the surfaces of the electrically conductive particles be completely coated, a partial presence of incompletely coated particles is permitted, as long as the desired effect can be achieved.

The electrically conductive particles (A), whose surfaces are to be coated with a carbon simple substance and/or a carbon compound, may be, for example, metal fine particles of: gold (Au), silver (Ag), copper (Cu), nickel (Ni), tin (Sn), bismuth (Bi), lead (Pb), zinc (Zn), palladium (Pd), platinum (Pt), aluminum (Al), tungsten (W) or molybdenum (Mo). In particular, preferred are metal fine particles containing at least one element selected from the group consisting of gold, silver, copper, nickel, tin, bismuth, lead, zinc, palladium, platinum, aluminum and carbon, and more preferred are metal fine particles of silver.

The electrically conductive particles (A) whose surfaces are coated with a carbon simple substance and/or a carbon compound preferably have a primary particle size of from 1 to 700 nm to form a fine conductive pattern having a desired electrical conductivity. The primary particle size of the electrically conductive particles (A) whose surfaces are coated with a carbon simple substance and/or a carbon compound, as used herein, can be determined by selecting 100 primary particles at random using a scanning electron microscope, and calculating the mean value of the particle sizes of the respective primary particles. The particle size of each of the primary particles can be determined by measuring the longer diameter and the shorter diameter of each primary particle, and calculating the mean value of the measured diameters. The electrically conductive particles (A) whose surfaces are coated with a carbon simple substance and/or a carbon compound preferably have a primary particle size of 10 to 200 nm, and more preferably 10 to 60 nm.

The surface coating layer preferably has an average thickness of 0.1 to 10 nm. When the average thickness is within the above described range, the fusion between the electrically conductive fine particles can be prevented to improve the patternability of a fine pattern. In addition, a desired electrical conductivity can be imparted to the electrically conductive particles, by carrying out a heat treatment at a temperature of 300° C. or lower.

The average thickness of the surface coating layer can be calculated as follows. The electrically conductive particles (A) whose surfaces are coated with a carbon simple substance and/or a carbon compound are subjected to a measurement by a thermobalance, to determine the decrease in mass due to heating. Assuming that the thus measured decrease in mass is entirely attributable to the combustion of carbon, and using the value 2.0 as the density of carbon, which is determined from the particle size, the average thickness of the surface coating layer can then be calculated. Suppose electrically conductive particles having a known particle size (Dp) are coated with carbon to an average thickness A (μm). The number of particles coated with carbon is represented as n. When the mass of the electrically conductive particles first weighed in the thermobalance measurement is represented as $W_1$ (g), the mass thereof after completely burning off carbon is represented as $W_2$ (g), and the density of the electrically conductive particles is represented as ρ, the value of n can be calculated according to equation (1), based on the known and measured values Dp and $W_2$:

$$W_2 = \pi/6 \times Dp^3 \rho \times n \quad (1).$$

Subsequently, the average thickness A of the surface coating layer can be calculated according to equation (2):

$$W_1 - W_2 = \{4/3 \times \pi (Dp/2 + A)^3 - \pi/6 \times Dp^3\} \times 2.0 \times n \quad (2).$$

The electrically conductive particles (A) whose surfaces are coated with a carbon simple substance and/or a carbon compound are preferably contained in the photosensitive resin composition in a content of 65 to 95% by mass, more preferably 70 to 95% by mass, and still more preferably 70 to 90% by mass. When the content of the electrically conductive particles (A) is within the above described range, it becomes possible to simultaneously attain patternability and electrical conductivity. The term "total solid content" as used herein refers to the total content of all the components contained in the photosensitive resin composition, excluding the solvent contained therein.

The proportion of the electrically conductive particles (A) whose surfaces are coated with a carbon simple substance and/or a carbon compound with respect to the total solid content can be calculated by a quantitative analysis of all the components in the photosensitive resin composition. The proportions of the respective components to be described later can also be calculated in the same manner.

The method of analyzing all the components in the photosensitive resin composition is as shown below.
(i) The photosensitive resin composition is diluted with an organic solvent, subjected to $^1$H-NMR measurement, GC measurement, and GC/MS measurement, and the outline of the results thereof are examined.
(ii) The photosensitive resin composition is extracted with an organic solvent, and then centrifuged to separate soluble and insoluble fractions.
(iii) The resulting insoluble fraction is extracted with a highly polar organic solvent, and then centrifuged to further separate soluble and insoluble fractions.
(iv) A mixed liquid of the soluble fractions obtained in the above (ii) and (iii) is subjected to IR measurement, $^1$H-NMR measurement and GC/MS measurement. Further, the mixed liquid is fractionated by preparative GPC. The resulting fractions are subjected to IR measurement and $^1$H-NMR measurement. If necessary, the above obtained fractions are subjected to GC measurement, GC/MS measurement, pyrolysis GC/MS measurement, and MALDI/MS measurement.
(v) The insoluble fraction obtained in the above (iii) is subjected to IR measurement or TOF-SIMS measurement. When the presence of an organic matter(s) is confirmed, the pyrolysis GC/MS or TPD/MS measurement is carried out.
(vi) The contents of the respective components contained in the photosensitive resin composition can be determined based on a comprehensive judgment of the measured results obtained in the above (i), (iv) and (v). The highly polar organic solvent to be used in the above (iii) is preferably chloroform, methanol or the like.

Alkali-Soluble Resin (B) Containing Acid-Dissociation Group

When the alkali-soluble resin contains an acid-dissociation group, the acid-dissociation group is released, decomposed, and gasified during a heat treatment after the formation of a pattern, to cause the resulting pattern to shrink. This accelerates the contact between the electrically conductive particles (A) whose surfaces are coated with a carbon simple substance and/or a carbon compound, thereby improving the electrical conductivity and enabling the formation of a fine pattern. The alkali-soluble resin (B) containing an acid-dissociation group can be obtained, in general, by copolymerizing a compound containing a carboxyl group, a compound containing an acid-dissociation group, and another monomer(s). The alkali-soluble resin (B) containing an acid-dissociation group is preferably a (meth)acrylic copolymer. The term "(meth)acrylic copolymer" as used herein refers to a copolymer which contains at least a (meth)acrylic monomer as a copolymerization component. Examples of the (meth)acrylic monomer include methyl (meth)acrylate, ethyl (meth)acrylate, n-propyl (meth)acrylate, isopropyl (meth)acrylate, n-butyl (meth)acrylate, sec-butyl (meth) acrylate, isobutyl (meth)acrylate, tert-butyl (meth)acrylate, n-pentyl (meth)acrylate, allyl (meth)acrylate, benzyl (meth) acrylate, butoxyethyl (meth)acrylate, butoxytriethylene glycol (meth)acrylate, cyclohexyl (meth)acrylate, dicyclopentanyl (meth)acrylate, dicyclopentenyl (meth)acrylate, 2-ethylhexyl (meth)acrylate, glycerol (meth)acrylate, glycidyl (meth)acrylate, heptadecafluorodecyl (meth)acrylate, 2-hydroxyethyl (meth)acrylate, isobonyl (meth)acrylate, 2-hydroxypropyl (meth)acrylate, isodecyl (meth)acrylate, isooctyl (meth)acrylate, lauryl (meth)acrylate, 2-methoxyethyl (meth)acrylate, methoxyethylene glycol (meth)acrylate, methoxydiethylene glycol (meth)acrylate, octafluoropentyl (meth)acrylate, phenoxyethyl (meth)acrylate, stearyl (meth)acrylate, trifluoroethyl (meth)acrylate, (meth)acrylamide, aminoethyl (meth)acrylate, phenyl (meth)acrylate, 1-naphthyl (meth)acrylate, 2-naphthyl (meth)acrylate, thiophenol (meth)acrylate and benzylmercaptan (meth)acrylate.

As a copolymerization component other than the (meth)acrylic monomer, it is possible to use a compound containing a carbon-carbon double bond. Examples of such a compound include: aromatic vinyl compounds such as styrene, p-methylstyrene, o-methylstyrene, m-methylstyrene and α-methylstyrene; unsaturated amide compounds such as (meth)acrylamide, N-methylol(meth)acrylamide and N-vinylpyrrolidone; (meth)acrylonitrile, allyl alcohol, vinyl acetate, cyclohexyl vinyl ether, n-propyl vinyl ether, i-propyl vinyl ether, n-butyl vinyl ether, i-butyl vinyl ether, 2-hydroxyethyl vinyl ether and 4-hydroxybutyl vinyl ether.

Examples of the compound containing a carboxyl group, which is a copolymerization component that imparts alkali solubility to the alkali-soluble resin (B) containing an acid-dissociation group, include (meth)acrylic acid, itaconic acid, crotonic acid, maleic acid and fumaric acid, and acid anhydrides thereof.

In using the (meth)acrylic copolymer, it is preferred to use a (meth)acrylic copolymer which contains a carbon-carbon double bond in a side chain or at a molecular end to accelerate the speed of the curing reaction of the photosensitive resin composition, initiated by exposure. Examples of a functional group having a carbon-carbon double bond include vinyl group, allyl group and (meth)acrylic group. To add such a functional group to the (meth)acrylic copolymer, a method is known in which a compound containing a glycidyl group or an isocyanate group and a carbon-carbon double bond, or a (meth)acrylic acid chloride or allyl chloride, is added to a mercapto group, an amino group, a hydroxyl or a carboxyl group in the (meth)acrylic copolymer.

Examples of the compound containing a glycidyl group and a carbon-carbon double bond include: glycidyl (meth)acrylate, allyl glycidyl ether and glycidyl ethylacrylate; and crotonyl glycidyl ether, glycidyl crotonate and glycidyl isocrotonate. Examples of the compound containing an isocyanate group and a carbon-carbon double bond include (meth)acryloyl isocyanate and (meth)acryloyloxyethyl isocyanate. Examples of the compound containing an acid-dissociation group include a (meth)acrylic acid ester containing an acid-dissociation group.

For the acid-dissociation group to decompose and gasify after being released, the acid-dissociation group is preferably an organic group having 4 to 15 carbon atoms, and more preferably an organic group having 6 to 15 carbon atoms. When the acid-dissociation group has less than 4 carbon atoms, the acid-dissociation group which has been released gasifies at a low temperature. This causes large air bubbles to form within the resulting film, to interfere with the contact between the electrically conductive particles (A) whose surfaces are coated with a carbon simple substance and/or a carbon compound, possibly resulting in the deterioration of the electrical conductivity. When the acid-dissociation group has more than 15 carbon atoms, on the other hand, the acid-dissociation group which has been released may remain in the resulting film, to interfere with the contact between the electrically conductive particles (A) whose surfaces are coated with a carbon simple substance and/or a carbon compound, possibly resulting in the deterioration of the electrical conductivity, as well. When the acid-dissociation group is an organic group having from 6 to 15 carbon atoms, it is possible to form an electrically conductive pattern having a good electrical conductivity, because, even if air bubbles are generated in the resulting film, the air bubbles can be easily eliminated by post-baking.

Examples of the acid-dissociation group include tert-butyl group, tert-butoxycarbonyl group, benzyl group, methyladamantyl group and tetrahydropyranyl group.

Examples of the (meth)acrylic acid ester containing an acid-dissociation group include 1-methyladamantyl (meth)acrylate, tert-butyl (meth)acrylate, benzyl (meth)acrylate and tetrahydropyranyl (meth)acrylate.

In the photosensitive resin composition, the content of the alkali-soluble resin (B) containing an acid-dissociation group is preferably 5 to 30% by mass with respect to the total solid content, from the viewpoint of improving the photosensitivity.

The alkali-soluble resin (B) containing an acid-dissociation group is preferably an alkali-soluble resin which is obtained by radical copolymerization such that 20 to 80% by mole of the compound containing an acid-dissociation group is contained. In particular, it is preferred that the alkali-soluble resin contains 20 to 80% by mole of the (meth)acrylic acid ester containing an acid-dissociation group, as a monomer component. The use of the alkali-soluble resin (B) containing an acid-dissociation group facilitates the thermo-oxidative decomposition and release of the acid-dissociation group in the air, at a temperature of 100 to 300° C., to cause a large shrinkage in the resulting film. This enables to easily increase the concentration of the electrically conductive particles (A) whose surfaces are coated with a carbon simple substance and/or a carbon compound, in the total solid content. As a result, a desired electrical conductivity corresponding to a resistivity of 10 to 1,000 μΩ·cm can be easily obtained. In this example, the use of a thermal acid generator and/or a photoacid generator to be described later in combination leads to a more pronounced effect.

The alkali-soluble resin (B) containing an acid-dissociation group preferably has a carboxylic acid equivalent of 200 to 1,400 g/mol, and more preferably 400 to 1,000 g/mol. The carboxylic acid equivalent of the acrylic resin can be calculated by measuring the acid value of the resin. Further, the alkali-soluble resin (B) containing an acid-dissociation group preferably has a double bond equivalent of 150 to 10,000 g/mol since it allows for balancing hardness and crack resistance at a high level. The double bond equivalent of the acrylic resin can be calculated by measuring the iodine value of the resin.

The alkali-soluble resin (B) containing an acid-dissociation group preferably has a weight average molecular weight (Mw) in terms of polystyrene, as measured by gel permeation chromatography (GPC), of 1,000 to 100,000. When the alkali-soluble resin (B) has a weight average molecular weight (Mw) within the above range, it is possible to obtain good coating properties, as well as a good solubility in a developer used in the formation of a pattern.

Metal Chelate Compound (C)

The metal chelate compound (C) refers to a compound containing a central metal, and ligands coordinated to the central metal at two or more sites. In the metal chelate compound (C), each ligand is capable of being easily released and forming a complex with an alkali-soluble functional group. The formation of a complex with an alkali-soluble resin makes it possible to control the developability of the resin component, and exhibit a pronounced effect of preventing the peeling of the resulting pattern.

Examples of metal elements to be contained in the metal chelate compound (C) include Au (gold), Ag (silver), Cu (copper), Cr (chromium), Fe (iron), Co (cobalt), Ni (nickel), Bi (bismuth), Sn (tin), Pb (lead), Zn (zinc), Pd (palladium), In (indium), Pt (platinum), Mg (magnesium), Al (aluminum), Ti (titanium), Zr (zirconium), W (tungsten) and Mo (molybdenum). Among these, Mg (magnesium), Al (aluminum), Ti (titanium), Zr (zirconium) or Bi (bismuth) is preferred from the viewpoint of facilitating the release of the ligand, and Al (aluminum), Zr (zirconium) or Bi (bismuth) is more preferred from the viewpoint of securing the stability of the complex with an alkali-soluble functional group. The metal chelate compound (C) can be easily obtained by allowing a metal alkoxide to react with a chelating agent. Examples of the chelating agent include: β-diketones such as acetylacetone, benzoylacetone and dibenzoylmethane; and β-keto esters such as ethyl acetoacetate and ethyl benzoylacetate.

Examples of the metal chelate compound (C) include: magnesium chelate compounds such as magnesium bis(acetylacetonate), magnesium bis(ethylacetoacetate), magnesium isopropoxy-mono(acetylacetonate) and magnesium isopropoxy-mono(ethyl acetoacetate); aluminum chelate compounds such as ethyl acetoacetate aluminum diisopropylate, aluminum tris(ethylacetoacetate), alkyl acetoacetate aluminum diisopropylate, aluminum monoacetylacetonate bis(ethylacetoacetate) and aluminum tris(acetylacetonate); titanium chelate compounds such as titanium tetrakis(acetylacetonate), titanium diisopropoxybis(ethylacetoacetate), titanium diisopropoxy-bis(acetylacetonate), titanium di-n-octyloxybis(octyleneglycolate), titanium diisopropoxy-bis(triethanolaminato), titanium dihydroxy-bis(2-hydroxypropionate) and titanium dihydroxy-bis(2-hydroxypropionate) ammonium salt; zirconium chelate compounds such as zirconium tetra(acetylacetonate), zirconium dibutoxybis(ethylacetoacetate), zirconium tributoxy monoacetylacetonate and zirconium tributoxy monostearate; gold chelate compounds such as gold bis(acetylacetonate) and gold bis(ethylacetoacetate); silver chelate compounds such as silver bis(acetylacetonate) and silver bis(ethylacetoacetate); copper chelate compounds such as copper bis(acetylacetonate) and copper bis(ethylacetoacetate); chromium chelate compounds such as chromium bis(acetylacetonate) and chromium bis(ethylacetoacetate); iron chelate compounds such as iron bis(acetylacetonate) and iron bis(ethylacetoacetate); cobalt chelate compounds such as cobalt bis(acetylacetonate) and cobalt bis(ethylacetoacetate); nickel chelate compounds such as nickel bis(acetylacetonate) and nickel bis(ethylacetoacetate); bismuth chelate compounds such as bismuth bis(acetylacetonate) and bismuth bis(ethylacetoacetate); tin chelate compounds such as tin bis(acetylacetonate) and tin bis(ethylacetoacetate); lead chelate compounds such as lead bis(acetylacetonate) and lead bis(ethylacetoacetate); zinc chelate compounds such as zinc bis(acetylacetonate) and zinc bis(ethylacetoacetate); palladium chelate compounds such as palladium bis(acetylacetonate) and palladium bis(ethylacetoacetate); indium chelate compounds such as indium bis(acetylacetonate) and indium bis(ethylacetoacetate); platinum chelate compounds such as platinum bis(acetylacetonate) and platinum bis(ethylacetoacetate); tungsten chelate compounds such as tungsten bis(acetylacetonate) and tungsten bis(ethylacetoacetate); and molybdenum chelate compounds such as molybdenum bis(acetylacetonate) and molybdenum bis(ethylacetoacetate).

The metal chelate compound (C) may be, for example, a compound represented by General Formula (1):

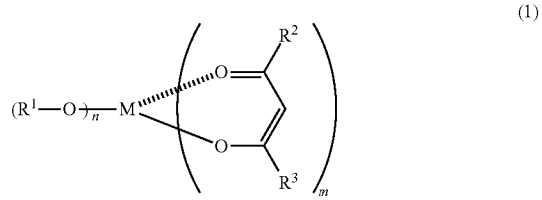

wherein M represents a magnesium atom, an aluminum atom, a titanium atom, a zirconium atom or a bismuth atom; each $R^1$ represents a hydrogen atom, an alkyl group having from 1 to 10 carbon atoms, a cycloalkyl group having from 4 to 10 carbon atoms or an aryl group having from 6 to 15 carbon atoms; each of $R^2$ and $R^3$ independently represents a hydrogen atom, an alkyl group having from 1 to 20 carbon atoms, a cycloalkyl group having from 4 to 10 carbon atoms, an aryl group having from 6 to 15 carbon atoms, an alkoxy group having from 1 to 6 carbon atoms or a hydroxy group; each of n and m represents an integer from 0 to 4, with the proviso that n+m=2 to 4.

Each $R^1$ preferably represents a hydrogen atom, an alkyl group having from 1 to 6 carbon atoms, a cycloalkyl group having from 4 to 7 carbon atoms or an aryl group having from 6 to 10 carbon atoms; and each of $R^2$ and $R^3$ is independently preferably a hydrogen atom, an alkyl group having from 1 to 18 carbon atoms, a cycloalkyl group having from 4 to 7 carbon atoms, an aryl group having from 6 to 10 carbon atoms, an alkoxy group having from 1 to 4 carbon atoms or a hydroxy group. Each of the above described alkyl group, cycloalkyl group, aryl group and alkoxy group may be an unsubstituted or substituted group. M is preferably an aluminum atom, a zirconium atom or a bismuth atom.

Examples of the compound represented by General Formula (1) include: magnesium chelate compounds such as magnesium bis(acetylacetonate), magnesium bis(ethylacetoacetate), magnesium isopropoxy-mono(acetylacetonate) and magnesium isopropoxy-mono(ethyl acetoacetate); aluminum chelate compounds such as ethyl acetoacetate aluminum diisopropylate, aluminum tris(ethylacetoacetate), alkyl acetoacetate aluminum diisopropylate, aluminum monoacetylacetonate bis(ethylacetoacetate) and aluminum tris(acetylacetonate); titanium chelate compounds such as titanium tetrakis(acetylacetonate), titanium diisopropoxy-bis(ethylacetoacetate), titanium diisopropoxy-bis(acetylacetonate), titanium di-n-octyloxy-bis(octyleneglycolate), titanium diisopropoxy-bis(triethanolaminato), titanium dihydroxy-bis(2-hydroxypropionate) and titanium dihydroxy-bis(2-hydroxypropionate) ammonium salt; zirconium chelate compounds such as zirconium tetra(acetylacetonate), zirconium dibutoxy-bis(ethylacetoacetate), zirconium tributoxy monoacetylacetonate and zirconium tributoxy monostearate; and bismuth chelate compounds such as bismuth bis(acetylacetonate) and bismuth bis(ethylacetoacetate).

The proportion of the metal chelate compound (C) with respect to the total solid content is preferably 0.01 to 10% by mass, more preferably from 0.05 to 5% by mass, and still more preferably 0.1 to 5% by mass. When the content of the metal chelate compound (C) is 0.01% by mass or more, the effect of suppressing residues on a substrate will be more pronounced. When the content of the metal chelate compound (C) is 10% by mass or less, on the other hand, it is possible to form a fine pattern having a high electrical conductivity.

Dispersant

The photosensitive resin composition may contain a dispersant. Incorporation of a dispersant allows the electrically conductive particles (A) whose surfaces are coated with a carbon simple substance and/or a carbon compound to be stably present in the photosensitive resin composition.

The dispersant is preferably an amine dispersant. Examples of commercially available amine dispersants include: DISPERBYK (registered trademark) 106, 108, 112, 116, 142, 145, 166, 180, 2001, 2008, 2022, 2150, 6919 and 21116 (all of the above manufactured by BYK Japan KK); and Efka (registered trademark) 4300, 4400, 4401, 4403, 4406, 4510, 4570, 4800, 5054, 5055 and 5207 (all of the above manufactured by BASF Japan Ltd.).

To achieve a further improvement in dispersibility, the dispersant preferably has an acrylic block copolymer structure. Examples of commercially available amine dispersants having an acrylic block copolymer structure include: DISPERBYK (registered trademark) 2001, 2008, 2022, 2150, 6919 and 21116; and Efka (registered trademark) 4300.

The content of the dispersant in the photosensitive resin composition is preferably 1 to 7 parts by mass with respect to 100 parts by mass of the total amount of the electrically conductive particles (A) whose surfaces are coated with a carbon simple substance and/or a carbon compound, and other particles to be described later. When the content of the dispersant is within the above described range, the electrically conductive particles (A) whose surfaces are coated with a carbon simple substance and/or a carbon compound can be well dispersed; a finer patterning can be achieved; the contact and fusion between the electrically conductive particles (A) whose surfaces are coated with a carbon simple substance and/or a carbon compound are facilitated; and a higher electrical conductivity can be obtained.

Photopolymerization Initiator

The photosensitive resin composition may contain a photopolymerization initiator. Incorporation of a photopolymerization initiator imparts a negative type photosensitivity to the photosensitive resin composition.

Examples of the photopolymerization initiator include acetophenone compounds, benzophenone compounds, benzoin ether compounds, α-aminoalkylphenone compounds, thioxanthone compounds, organic peroxides, imidazole compounds, titanocene compounds, triazine compounds, acylphosphine oxide compounds, quinone compounds and oxime ester compounds. Among these, an oxime ester compound is preferred, because it provides a high sensitivity, even when added in a small amount. An oxime ester compound having a carbazole skeleton is more preferred. Examples of an oxime ester compound which does not have a carbazole skeleton include Irgacure (registered trademark) OXE01 (manufactured by BASF Japan Ltd.). Examples of the oxime ester compound having a carbazole skeleton include Irgacure (registered trademark) OXE02 (manufactured by BASF Japan Ltd.), ADEKA OPTOMER (registered trademark) N1919 (manufactured by ADEKA Corporation), and ADEKA ARKLES (registered trademark) NCI-831 (manufactured by ADEKA Corporation).

Solvent

The photosensitive resin composition may contain a solvent. Examples of the solvent include propylene glycol monomethyl ether, propylene glycol monobutyl ether, 2-heptanol, cyclohexanol, cyclopentanol, 2-butanol, 2-pentanol, t-butanol, diacetone alcohol, α-terpineol, methyl 2-hydroxyisobutyrate, ethyl 2-hydroxyisobutyrate, propylene glycol monoethyl ether acetate, ethyl acetoacetate, methyl acetoacetate, methyl-3-methoxypropionate, 3-methyl-3-methoxybutyl acetate, cyclopentanone, cyclohexanone, benzyl ethyl ether, dihexyl ether, acetonylacetone, isophorone, benzyl acetate, ethyl benzoate, diethyl oxalate, diethyl maleate, ethylene carbonate, propylene carbonate, methyl benzoate, ethyl benzoate, diethyl malonate, β-propiolactone, γ-butyrolactone, γ-valerolactone, δ-valerolactone, γ-caprolactone, ε-caprolactone, ethylene glycol monobutyl ether acetate, diethylene glycol monoethyl ether acetate, diethylene glycol monobutyl ether acetate, diethylene glycol dimethyl ether, diethylene glycol diethyl ether, diethylene glycol methyl ethyl ether, dipropylene glycol methyl ether acetate, dipropylene glycol dimethyl ether, propylene glycol diacetate, 1,3-butylene glycol diacetate, cyclohexanol acetate, dimethyl sulfoxide, methyl ethyl ketone, isobutyl acetate, isobutyl acetate, butyl acetate, propyl acetate, isopropyl acetate, acetylacetone, triacetin and 2-heptanone.

Other Particles

The photosensitive resin composition may contain other particles other than the electrically conductive particles (A) whose surfaces are coated with a carbon simple substance and/or a carbon compound to improve the dispersibility and/or to control the electrical conductivity. Examples of other particles include metal fine particles and metal oxide fine particles whose surfaces are not coated; and organic pigments and inorganic pigments.

The above described other particles preferably have a particle size of 10 to 100 nm. When the above described other particles have a particle size of less than 10 nm, a larger amount of dispersant needs to be used to stabilize the dispersion, possibly resulting in a difficulty to obtain a desired electrical conductivity. When the above described other particles have a particle size of particle size of more than 100 nm, on the other hand, the resolution of the resulting pattern is decreased, possibly resulting in a difficulty to form a super fine pattern of 5 μm or less.

The above described other particles are preferably carbon black, which contributes to the control of the electrical conductivity.

Examples of the carbon black include: MA 77, 7, 8, 11, 100, 100R, 100S, 230, 220 and 14 (all of the above manufactured by Mitsubishi Chemical Corporation); #52, 47, 45, 45L, 44, 40, 33, 32, 30, 25, 20, 10, 5, 95, 85 and 260 (all of the above manufactured by Mitsubishi Chemical Corporation); Special Black 100, 250, 350 and 550 (all of the above manufactured by Evonik Degussa GmbH); and Printex 95, 90, 55, 45, 40, P, 60, L6, L, 300, 30, ES23, 9, ES22, 35, 25, 200, A and G (all of the above manufactured by Evonik Degussa GmbH). Among these, preferred is MA 77, 7, 8, 11, 100, 100R, 100S, 230, 220 or 14, or Special Black 100, 250, 350 or 550, which has a pH value of 4 or less. The pH value of carbon black can be measured in accordance with JIS K5101.

Thermal Acid Generator and Photoacid Generator

The photosensitive resin composition may contain a thermal acid generator and/or a photoacid generator. An acid generated by such an acid generator accelerates the decomposition of the acid-dissociation group in the alkali-soluble resin (B) containing an acid-dissociation group, thereby enabling to lower the temperature for carrying out a heat treatment in the air.

The thermal acid generator is a compound which generates an acid by application of heat. Examples thereof include: SI-60, SI-80, SI-100, SI-110, SI-145, SI-150, SI-60L, SI-80L, SI-100L, SI-110L, SI-145L, SI-150L, SI-160L, SI-180L and SI-200 (all of the above manufactured by Sanshin Chemical Industry Co., Ltd.), 4-hydroxyphenyldimethylsulfonium, benzyl-4-hydroxyphenylmethyl sulfonium, 2-methylbenzyl-4-hydroxyphenylmethyl sulfonium, 2-methylbenzyl-4-acetylphenylmethylsulfonium and 2-methylbenzyl-4-benzoyloxyphenylmethylsulfonium; and methanesulfonic acid salts, trifluoromethanesulfonic acid salts, camphorsulfonic acid salts and p-toluenesulfonic acid salts thereof. Among these, 4-hydroxyphenyldimethylsulfonium, benzyl-4-hydroxyphenylmethyl sulfonium, 2-methylbenzyl-4-hydroxyphenylmethylsulfonium, 2-methylbenzyl-4-acetylphenylmethylsulfonium or 2-methylbenzyl-4-benzoyloxyphenylmethylsulfonium; or a methanesulfonic acid salt, a trifluoromethanesulfonic acid salt, a camphorsulfonic acid salt or a p-toluenesulfonic acid salt thereof can be preferably used.

The content of the thermal acid generator in the photosensitive resin composition is preferably 0.01 to 20 parts by mass with respect to 100 parts by mass of the alkali-soluble resin (B) containing an acid-dissociation group. This is because, when the content of the thermal acid generator is adjusted within the above described range: the decomposition of the acid-dissociation group in the alkali-soluble resin (B) containing an acid-dissociation group is accelerated; the contact between the electrically conductive particles (A) whose surfaces are coated with a carbon simple substance and/or a carbon compound is not interfered with; and a higher electrical conductivity can be obtained.

The photoacid generator is a compound generating an acid by irradiation of light, and an acid generated by the photoacid generator is preferably a strong acid such as perfluoroalkylsulfonic acid or p-toluenesulfonic acid to accelerate the decomposition of the acid-dissociation group.

Examples of the photoacid generator include: SI-101, SI-105, SI-106, SI-109, PI-105, PI-106, PI-109, NAI-100, NAI-1002, NAI-1003, NAI-1004, NAI-101, NAI-105, NAI-106, NAI-109, NDI-101, NDI-105, NDI-106, NDI-109, PAI-01, PAI-101, PAI-106 and PAI-1001 (all of the above manufactured by Midori Kagaku Co., Ltd.); SP-077 and SP-082 (both manufactured by ADEKA Corporation); TPS-PFBS (manufactured by Toyo Gosei Co., Ltd); CGI-MDT and CGI-NIT (both manufactured by Chiba Japan Ltd.); and WPAG-281, WPAG-336, WPAG-339, WPAG-342, WPAG-344, WPAG-350, WPAG-370, WPAG-372, WPAG-449, WPAG-469, WPAG-505 and WPAG-506 (all of the above manufactured by Wako Pure Chemical Industries, Ltd.).

The content of the photoacid generator in the photosensitive resin composition is preferably 0.01 to 20 parts by mass with respect to 100 parts by mass of the alkali-soluble resin (B) containing an acid-dissociation group. This is because, when the content of the photoacid generator is adjusted within the above described range, the decomposition of the acid-dissociation group in the alkali-soluble resin (B) containing an acid-dissociation group is accelerated, the contact between the electrically conductive particles (A) whose surfaces are coated with a carbon simple substance and/or a carbon compound is not interfered with, and a higher electrical conductivity can be obtained. To further accelerate the decomposition of the acid-dissociation group, the thermal acid generator and the photoacid generator may be used in combination.

Polymerization Inhibitor

The photosensitive resin composition may contain a polymerization inhibitor. Incorporation of an adequate amount of a polymerization inhibitor improves the resolution after development. The polymerization inhibitor is not particularly limited, and a known polymerization inhibitor can be used. Examples of the polymerization inhibitor include di-t-butylhydroxytoluene, butylhydroxyanisole, hydroquinone, 4-methoxyphenol, 1,4-benzoquinone and t-butylcatechol. Examples of commercially available polymerization inhibitors include "IRGANOX 1010," "IRGANOX 1035," "IRGANOX 1076," "IRGANOX 1098," "IRGANOX 1135," "IRGANOX 1330," "IRGANOX 1726," "IRGANOX 1425," "IRGANOX 1520," "IRGANOX 245," "IRGANOX 259," "IRGANOX 3114," "IRGANOX 565" and "IRGANOX 295" (all of the above manufactured by BASF Japan Ltd.).

Sensitizer

When the photosensitive resin composition contains a photoacid generator, the photosensitive resin composition may further contain a sensitizer. The sensitizer is preferably one which gasifies when subjected to a heat treatment, or alternatively, one whose color fades when irradiated with light, even when the sensitizer remained in the resulting curing film. From the viewpoint of achieving a high resolution in patterning, the sensitizer is more preferably one whose color fades when irradiated with light.

Examples of the sensitizer which gasifies when subjected to a heat treatment, and the sensitizer whose color fades when irradiated with light include: coumarins such as 3,3'-carbonylbis(diethylaminocoumarin); anthraquinones such as 9,10-anthraquinone; aromatic ketones and biphenyls such as benzophenone, 4,4'-dimethoxybenzophenone, acetophenone, 4-methoxyacetophenone and benzaldehyde; and condensed aromatic compounds such as 1,4-dimethylnaphthalene, 9-fluorenone, fluorene, phenanthrene, triphenylene, pyrene, anthracene, 9-phenylanthracene, 9-methoxyanthracene, 9,10-di phenyl anthracene, 9,10-bis(4-methoxyphenyl)anthracene, 9,10-bis(triphenylsilyl)anthracene, 9,10-dimethoxyanthracene, 9,10-diethoxyanthracene, 9,10-dipropoxyanthracene (DPA; manufactured by Kawasaki Kasei Chemicals Ltd.), 9,10-dibutoxyanthracene (DBA; manufactured by Kawasaki Kasei Chemicals Ltd.), 9,10-dipentaoxyanthracene, 2-t-butyl-9,10-dibutoxyanthracene and 9,10-bis(trimethylsilylethynyl)anthracene.

The sensitizer which gasifies when subjected to a heat treatment is preferably a sensitizer which sublimates or vaporizes, or whose thermal decomposition product generated by thermal decomposition sublimates or vaporizes, when subjected to a heat treatment. The sensitizer is preferably gasified at a temperature of 150 to 300° C. so that the sensitizer does not gasify at the pre-bake temperature, but decomposes and gasifies during heat curing, to allow the contact and fusion between the electrically conductive particles (A) whose surfaces are coated with a carbon simple substance and/or a carbon compound.

Further, the sensitizer is preferably an anthracene compound. This is because an anthracene compound serves to achieve a high sensitivity and a high resolution, and also because the compound dimerizes and undergoes color-fading when irradiated with light. In particular, the sensitizer is preferably a 9,10-disubstituted anthracene compound, which is stable to heat, and more preferably a 9,10-dialkoxyanthracene compound represented by General Formula (2), from the viewpoint of improving the solubility of the sensitizer, and the reactivity of the photodimerization reaction:

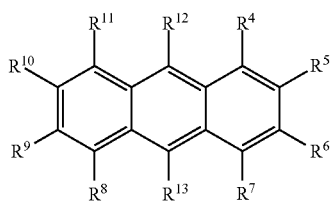

(2)

wherein each of $R^4$ to $R^{11}$ independently represents a hydrogen atom, an alkyl group, an alkoxy group, an alkenyl group, an ethynyl group, an aryl group or an acyl group having from 1 to 20 carbon atoms, or an organic group obtained by substituting any of these groups; each of $R^{12}$ and $R^{13}$ independently represents an alkoxy group having from 1 to 20 carbon atoms or an alkoxy group substituted with another organic group.

Examples of the alkyl group represented by any of $R^4$ to $R^{11}$ include methyl group, ethyl group and n-propyl group. Examples of the alkoxy group include methoxy group, ethoxy group, propoxy group, butoxy group and pentyloxy group. Examples of the alkenyl group include vinyl group, acryloxypropyl group and methacryloxypropyl group. Examples of the aryl group include phenyl group, tolyl group and naphthyl group. Examples of the acyl group include acetyl group. From the viewpoint of the gasification properties and the photodimerization reactivity of the compound, each of $R^4$ to $R^{11}$ is preferably a hydrogen atom or an organic group having from 1 to 6 carbon atoms, and each of $R^4$, $R^7$, $R^8$ and $R^{11}$ is more preferably a hydrogen atom.

A substituent for substituting the alkoxy group represented by $R^{12}$ and $R^{13}$ may be, for example, an alkoxy group or an acyl group. Examples of the alkoxy group in this case include methoxy group, ethoxy group, propoxy group, butoxy group, pentyloxy group, methoxyethoxy group, 1-methoxy-2-propoxy group and 1-acetyl-2-propoxy group. From the viewpoint of the solubility of the compound and the color-fading reaction due to photodimerization thereof, the alkoxy group is preferably propoxy group or butoxy group.

The content of the sensitizer in the photosensitive resin composition is preferably 0.001 to 20 parts by mass, and more preferably 0.005 to 15 parts by mass, with respect to 100 parts by mass of the alkali-soluble resin (B). This is because, when the content of the sensitizer is adjusted within the above described range: a sufficient sensitizing effect for exposing the photoacid generator can be obtained; the contact between the electrically conductive particles (A) whose surfaces are coated with a carbon simple substance and/or a carbon compound is not interfered with; and a higher electrical conductivity can be obtained.

Pigment and/or Dye Having Absorption in Visible Light Region

The photosensitive resin composition may contain a pigment and/or a dye having an absorption in the visible light region, as long as it does not interfere with the contact and fusion between the electrically conductive particles (A) whose surfaces are coated with a carbon simple substance and/or a carbon compound. When the photosensitive resin composition contains a pigment and/or a dye having an absorption in the visible light region, it becomes possible to prevent the electrically conductive pattern after post-baking from reflecting visible light.

Examples of the pigment having an absorption in the visible light region include lactam-based pigments, perylene-based pigments, phthalocyanine-based pigments, isoindoline-based pigments, diaminoanthraquinone-based pigments, dioxazine-based pigments, indanthrone-based pigments, carbon black and inorganic pigments.

Examples of blue pigments include C.I. Pigment Blue (hereinafter, referred to as "PB") 15, PB 15:1, PB 15:2, PB 15:3, PB 15:4, PB 15:5, PB 15:6, PB 16 and PB 60. Examples of purple pigments include C.I. Pigment Violet (hereinafter, referred to as "PV") 19, PV 23 and PV 37. Examples of red pigments include C.I. Pigment Red (hereinafter, referred to as "PR") 149, PR 166, PR 177, PR 179, PR 209 and PR 254. Examples of green pigments include C.I. Pigment Green (hereinafter, referred to as "PG") 7, PG 36 and PG 58. Examples of yellow pigments include C.I. Pigment Yellow (hereinafter, referred to as "PY") 150, PY 138, PY 139 and PY 185. Examples of black pigments include: furnace blacks such as HCF, MCF, LFF, RCF, SAF, ISAF, HAF, XCF, FEF, GPF and SRF; thermal blacks such as FT and MT; carbon blacks such as channel black and acetylene black; and lactam-based pigments (for example, "Irgaphor" (registered trademark) Black S0100 CF; manufactured by BASF Japan Ltd.). Among these, a carbon black is preferred because of its excellent heat resistant, light resistance and absorption in the visible light region, and a furnace black or a lactam-based pigment is more preferred from the viewpoint of the electrical conductivity and dispersibility.

Examples of the carbon black include: MA 77, 7, 8, 11, 100, 100R, 100S, 230, 220 and 14 (all of the above manufactured by Mitsubishi Chemical Corporation); #52, 47, 45, 45L, 44, 40, 33, 32, 30, 25, 20, 10, 5, 95, 85 and 260 (all of the above manufactured by Mitsubishi Chemical Corporation); Special Black 100, 250, 350 and 550 (all of the above manufactured by Evonik Degussa GmbH); and Printex 95, 90, 55, 45, 40, P, 60, L6, L, 300, 30, ES23, 9, ES22, 35, 25, 200, A and G. Among these, preferred is MA 77, 7, 8, 11, 100, 100R, 100S, 230, 220 or 14, or Special Black 100, 250, 350 or 550, which has a pH value of 4 or less. The pH value of carbon black can be measured in accordance with JIS K5101.

The amount of the pigment having an absorption in the visible light region to be added to the photosensitive resin composition is preferably 0.1 to 10% by mass with respect to the total solid content in the composition.

Examples of the dye having an absorption in the visible light region include ferrocene-based dyes, fluorenone-based dyes, perylene-based dyes, triphenylmethane-based dyes, coumarin-based dyes, diphenyl amine-based dyes, quinacridone-based dye, quinophthalone-based dyes, phthalocyanine-based dyes and xanthene-based dyes. Among these, a black dye is preferred because of its excellent heat resistant, light resistance and absorption in the visible light region; and VALIFAST (registered trademark) Black 1888, VALIFAST (registered trademark) Black 3830, NUBIAN (registered trademark) Black PA-2802 or OIL Black 860 is preferred.

The amount of the dye having an absorption in the visible light region to be added to the photosensitive resin composition is preferably 0.1 to 10% by mass with respect to the total solid content in the composition.

Other Components

The photosensitive resin composition may contain an acrylic monomer from the viewpoint of controlling the photosensitivity and improving the patternability, as long as it does not interfere with the contact and fusion between the electrically conductive particles (A) whose surfaces are coated with a carbon simple substance and/or a carbon compound.

Examples of the acrylic monomer include: trimethylolpropane tri(meth)acrylate, pentaerythritol tri(meth)acrylate, pentaerythritol penta(meth)acrylate, pentaerythritol tetra(meth)acrylate, dipentaerythritol hexa(meth)acrylate and dipentaerythritol penta(meth)acrylate; and alkyl-modified products thereof, alkyl ether-modified products thereof, and alkyl ester-modified products thereof.

If necessary, the photosensitive resin composition may further contain an adhesion promoter, a surfactant, a polymerization inhibitor and/or the like.

Examples of the adhesion promoter include silane coupling agents such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane and 3-mercaptopropyltrimethoxysilane.

Examples of the surfactant include: anionic surfactants such as ammonium lauryl sulfate and polyoxyethylene alkyl ether sulfate triethanolamine; cationic surfactants such as stearylamine acetate and lauryl trimethyl ammonium chloride; amphoteric surfactants such as lauryl dimethylamine oxide and lauryl carboxymethyl hydroxyethyl imidazolium betaine; nonionic surfactants such as polyoxyethylene lauryl ether, polyoxyethylene stearyl ether and sorbitan monostearate; fluorine-based surfactants; and silicone-based surfactants.

The amount of the surfactant to be added to the photosensitive resin composition is preferably 0.001 to 10% by mass, and more preferably 0.01 to 1% by mass with respect to the total amount of the composition to improve the coating properties and the uniformity of the coating film surface. When the added amount of the surfactant is less than 0.001% by mass, the effect of improving the coating properties and the uniformity of the coating film surface may be insufficient. When the added amount of the surfactant is more than 10% by mass, on the other hand, there is a possibility that coating film defects such as pin holes and dents, and/or agglomeration of particles may occur.

Examples of the polymerization inhibitor include hydroquinone compounds, catechol compounds, phosphorus compounds, sulfur compounds, amine compounds and hindered phenol antioxidant compounds. Among these, a hydroquinone compound or a catechol compound is preferred since such a compound does not impair the solubility in a solvent or the dispersion stability of a pigment. More preferred is hydroquinone, tert-butylhydroquinone, 2,5-bis(1,1,3,3-tetramethylbutyl)hydroquinone, 2,5-bis(1,1-dimethylbutyl)hydroquinone, catechol or tert-butylcatechol.

Method of Producing Photosensitive Resin Composition

The photosensitive resin composition is produced using a disperser such as a ball mill, a sand grinder, a triple roll mill, a mild disperser, a medialess disperser, or the like. When it is desired to uniformly disperse the electrically conductive particles (A) whose surfaces are coated with a carbon simple substance and/or a carbon compound, the photosensitive resin composition may be produced by a method in which the electrically conductive particles (A) whose surfaces are coated with a carbon simple substance and/or a carbon compound are dispersed in an organic solvent, using a dispersant, to prepare a dispersion liquid in advance; and the thus prepared dispersion liquid is mixed with a solution containing a monomer, a polymer, an adhesion promoter, a surfactant, a polymerization inhibitor and the like. The dispersion liquid of the electrically conductive particles (A) whose surfaces are coated with a carbon simple substance and/or a carbon compound is preferably prepared by dispersing the conductive particles using a mild disperser or a medialess disperser, more preferably using a medialess disperser to prevent the surface coating layer from being damaged. The dispersion liquid of the electrically conductive particles (A) whose surfaces are coated with a carbon simple substance and/or a carbon compound is prepared, for example, by dispersing the electrically conductive particles (A) whose surfaces are coated with a carbon simple substance and/or a carbon compound, in an organic solvent, using a disperser such as a mild disperser, NANOGETTER (registered trademark) (manufactured by Ashizawa Finetech Ltd.) or a high-pressure, wet-type, medialess pulverizer, NANOMIZER (manufactured by Nanomizer Inc.).

Method of Producing Electrically Conductive Pattern

Next, a description will be given regarding the method of producing an electrically conductive pattern by a photolithography method, using the photosensitive resin composition.

The method of producing an electrically conductive pattern is carried out by a process including: a coating step of coating the photosensitive resin composition on a surface of a base material to form a coating film; a pre-baking step of drying the coating film; a step (exposure/development step) of exposing and developing the dried film to form a pattern; and a post-baking step of post-baking the pattern.

The base material to be used in the coating step may be, for example, a silicon wafer, a ceramic base material or an organic base material. Examples of the ceramic base material include: glass base materials such as those made of soda-lime glass, non-alkali glass, borosilicate glass and quartz glass; alumina base materials; aluminum nitride base materials and silicon carbide base materials. Examples of the organic base material include epoxy base materials, polyether imide resin base materials, polyether ketone resin base materials, polysulfone resin base materials, polyimide films and polyester films.

The coating method for coating the photosensitive resin composition on a surface of a base material may be, for example, coating using a spin coater, a bar coater, a blade coater, a roll coater, a die coater, a calender coater or a meniscus coater, screen printing, spray coating or dip coating.

The drying method to be used in the pre-baking step may be, for example, drying using a hot plate or a hot air dryer (oven), drying under reduced pressure, vacuum drying, or drying by infrared radiation.

The temperature and the period of time to carry out the pre-baking may be selected as appropriate, depending on the composition of the photosensitive resin composition and the film thickness of the coating film to be dried. The pre-baking is preferably carried out by heating at a temperature of 50 to 150° C., for a period of time 10 seconds to 30 minutes.

In particular, it is preferred that the heating with a hot plate or a hot air dryer (oven) and drying under reduced pressure be used in combination, because it allows for removing the solvent, while preventing the heat curing of the resin contained in the coating film. The ultimate pressure in the drying under reduced pressure is preferably 10 to 200 Pa, and more preferably 30 to 100 Pa.

A preferred light source to be used in the exposure step may be, for example, j-ray, ray, h-ray or g-ray of a mercury lamp.

Examples of an alkaline substance to be contained in an alkaline developer used in the development step include: inorganic alkalis such as sodium hydroxide, potassium hydroxide, sodium carbonate, potassium carbonate, sodium silicate, sodium metasilicate and ammonia water; and organic alkalis including: primary amines such as ethylamine and n-propylamine; secondary amines such as diethylamine and di-n-propylamine; tertiary amines such as triethylamine and methyldiethylamine; tetraalkylammonium hydroxides such as tetramethylammonium hydroxide (TMAH); quaternary ammonium salts such as choline; alcohol amines such as triethanolamine, diethanolamine, monoethanolamine, dimethylaminoethanol and diethylaminoethanol; and cyclic amines such as pyrrole, piperidine, 1,8-diazabicyclo[5,4,0]-7-undecene, 1,5-diazabicyclo[4,3,0]-5-nonane and morpholine. A water-soluble organic solvent such as ethanol, γ-butyrolactone, dimethylformamide or N-methyl-2-pyrrolidone may be added as appropriate, to any of the above described alkaline developers.

In addition, it is preferred to further add from 0.01 to 1% by mass of a surfactant such as a nonionic surfactant, to any of these alkaline developers to obtain a better electrically conductive pattern.

The drying method to be used in the post-baking step may be, for example, the same method as that used in the pre-baking step. The atmosphere, the temperature and the period of time for carrying out the post-baking may be selected as appropriate, depending on the composition of the photosensitive resin composition and the film thickness of the coating film to be dried. However, the post-baking is preferably carried out by heating at a temperature of 100 to 300° C., for a period of time 5 to 120 minutes, in the air.

When an electrically conductive pattern is formed on a base material in the form of a mesh, the resulting pattern can be used as a transparent conductive wiring to be included in a device such as a touch panel, a display panel of a liquid crystal display or an organic EL display, or a wearable terminal.

Since the above described electrically conductive pattern is not transparent, the resulting wiring can be visibly recognized by a user of the device, if the pattern has a large width. Accordingly, the electrically conductive pattern preferably has a width of 5 μm or less.

Film Containing Organic Component

A description will be given below regarding a film containing an organic component. The film containing an organic component preferably contains an alkali-soluble resin as a constituent component. When the film containing an organic component contains an alkali-soluble group, it enables the formation of a complex with the metal chelate compound (C) contained in the photosensitive resin composition. Since the metal chelate (C) is capable of forming a complex also with the alkali-soluble resin (B) containing an acid-dissociation group contained in the photosensitive resin composition adhesion during development can be improved. This allows for processing under harsh development conditions, thereby enabling to reduce residues after development.

The alkali-soluble resin to be contained in the film containing an organic component preferably contains a polar group. Examples of the polar group include hydroxyl group, carbonyl group, carboxyl group, amino group, nitro group and cyano group. Among these, carboxyl group is preferred from the viewpoint of improving alkali developability.

Further, the alkali-soluble resin to be contained in the film containing an organic component is preferably a cardo type resin which serves to form a film having a high density after curing, from the viewpoint of improving the reliability. It is preferred that the film containing an organic component further contain an acrylic polymer, in addition to a cardo type resin such that the content ratio of the cardo type resin to the acrylic polymer, in weight ratio, is 1:10 to 10:1, and more preferably 1:8 to 7:1.

As the cardo type resin to be contained in the film containing an organic component, a commercially available product can be preferably used. Examples thereof include: "WR-301 (brand name)" (manufactured by ADEKA Corporation); "V-259ME (brand name)" (manufactured by Nippon Steel & Sumikin Chemical Co., Ltd.); and "OGSOL CR-TR1 (brand name)," "OGSOL CR-TR2 (brand name)," "OGSOL CR-TR3 (brand name)," "OGSOL CR-TR4 (brand name)," "OGSOL CR-TR5 (brand name)" and "OGSOL CR-TR6 (brand name)" (all of the above manufactured by Osaka Gas Chemicals Co., Ltd.).

As the acrylic polymer, it is possible to use, for example, an acrylic polymer having an alicyclic unit in a side chain. The acrylic polymer is preferably one which can be obtained by radical copolymerization of a carboxyl group- and/or acid anhydride group-containing (meth)acrylic compound, and a (meth)acrylic acid ester, and/or maleimide or a maleimide derivative, followed by an addition reaction of an epoxy compound containing a group having an ethylenic unsaturated double bond.

A catalyst to be used in the radical polymerization is not particularly limited, and an azo compound such as azobisisobutyronitrile or an organic peroxide such as benzoyl peroxide and the like is generally used.

A catalyst to be used in the addition reaction of the epoxy compound containing a group having an ethylenic unsaturated double bond is not particularly limited, and a known catalyst can be used. Examples thereof include: amino catalysts such as dimethylaniline, 2,4,6-tris(dimethylaminomethyl)phenol and dimethylbenzylamine; tin catalysts such as tin(II) 2-ethylhexanoate and dibutyltin laurate; titanium catalysts such as titanium(IV) 2-ethylhexanoate; phosphorus catalysts such as triphenylphosphine; and chromium catalysts such as chromium acetylacetonate and chromium chloride.

Examples of the carboxyl group- and/or acid anhydride group-containing (meth)acrylic compound include (meth)acrylic acid, (meth)acrylic acid anhydride, itaconic acid, itaconic anhydride, mono(2-acryloyloxyethyl) succinate, mono(2-acryloyloxyethyl) phthalate and mono(2-acryloyloxyethyl) tetrahydrophthalate.

Examples of the (meth)acrylic acid ester include methyl (meth)acrylate, ethyl (meth)acrylate, propyl (meth)acrylate, cyclopropyl (meth)acrylate, cyclopentyl (meth)acrylate, cyclohexyl (meth)acrylate, cyclohexenyl (meth)acrylate, 4-methoxycyclohexyl (meth)acrylate, 2-cyclopropyloxycarbonylethyl (meth)acrylate, 2-cyclopentyloxycarbonylethyl (meth)acrylate, 2-cyclohexyloxycarbonylethyl (meth)acrylate, 2-cyclohexenyloxycarbonylethyl (meth)acrylate, 2-(4-methoxycyclohexyl)oxycarbonylethyl (meth)acrylate, norbornyl (meth)acrylate, isobonyl (meth)acrylate, tricyclodecanyl (meth)acrylate, tetracyclodecanyl (meth)acrylate, dicyclopentenyl (meth)acrylate, adamantyl (meth)acrylate, adamantylmethyl (meth)acrylate and 1-methyladamantyl (meth)acrylate. Further, an aromatic vinyl compound(s) such as styrene, p-methyl styrene, o-methylstyrene, m-methylstyrene and/or α-methylstyrene may be copolymerized with the (meth)acrylic acid or the (meth) acrylic acid ester described above.

Examples of the maleimide or a maleimide derivative include maleimide, N-methyl-maleimide, N-ethylmaleimide, N-n-propylmaleimide, N-isobutylmaleimide, N-n-butylmaleimide, N-t-butylmaleimide, N-n-hexylmaleimide, N-dodecylmaleimide, N-cyclopentylmaleimide, N-cyclohexylmaleimide, N-(2,4-dimethylcyclohexyl)maleimide, N-vinylmaleimide, N-(meth)acrylic maleimide, N-methoxymethylmaleimide, N-(2-ethoxyethyl)maleimide, N-[3-(meth)acryloxypropyl]maleimide, N-methoxycarbonylmaleimide, N-(3-methoxycarbonylpropyl)maleimide, N-(2-hydroxyethyl)maleimide, N-(4-hydroxy-n-butyl)maleimide, N-(2-carboxyethyl)maleimide, N-(3-carboxypropyl) maleimide, N-(5-carboxypentyl)maleimide, N-phenylmaleimide, N-(4-methylphenyl)maleimide, N-(3-methylphenyl) maleimide, N-(2-methylphenyl)maleimide, N-(2,6-dimethylphenyl)maleimide, N-(2,6-diethylphenyl) maleimide, N-(4-styryl)maleimide, N-(4-methoxyphenyl) maleimide, N-(3-methoxyphenyl)maleimide, N-(2-methoxyphenyl)maleimide, N-(4-hydroxyphenyl) maleimide, N-(3-hydroxyphenyl)maleimide, N-(2-hydroxyphenyl)maleimide, N-(4-carboxyphenyl) maleimide, N-(1-naphthyl)maleimide, N-benzylmaleimide and N-(2-phenylethyl)maleimide.

Examples of the epoxy compound containing a group having an ethylenic unsaturated double bond include glycidyl (meth)acrylate, α-ethylglycidyl (meth)acrylate, α-n-propylglycidyl (meth)acrylate, α-n-butylglycidyl (meth) acrylate, 3,4-epoxybutyl (meth)acrylate, 3,4-epoxyheptyl (meth)acrylate, 3,4-epoxycyclohexylmethyl (meth)acrylate, α-ethyl-6,7-epoxyheptyl (meth)acrylate, allyl glycidyl ether, vinyl glycidyl ether, o-vinylbenzyl glycidyl ether, m-vinylbenzyl glycidyl ether, p-vinylbenzyl glycidyl ether, a-methyl-o-vinylbenzyl glycidyl ether, α-methyl-m-vinylbenzyl glycidyl ether, α-methyl-p-vinylbenzyl glycidyl ether, 2,3-diglycidyloxymethylstyrene, 2,4-diglycidyloxymethylstyrene, 2,5-diglycidyloxymethyl styrene, 2,6-diglycidyloxymethylstyrene, 2,3,4-triglycidyloxymethylstyrene, 2,3,5-triglycidyloxymethylstyrene, 2,3,6-triglycidyloxymethylstyrene, 3,4,5-triglycidyloxymethyl styrene and 2,4,6-triglycidyloxymethylstyrene.

As the acrylic polymer, it is possible to use a polymer obtained by polymerizing a polyfunctional (meth)acrylate compound and a polyvalent mercapto compound by Michael addition (to the β-position with respect to the carbonyl group).

Preferred specific examples of the polyfunctional (meth) acrylate compound include (meth)acrylic acid esters such as: ethylene glycol di(meth)acrylate, diethylene glycol di(meth) acrylate, tri ethylene glycol di(meth)acrylate, tetraethylene glycol di(meth)acrylate, tetramethylene glycol di(meth) acrylate, trimethylolpropane tri(meth)acrylate, ethylene oxide-modified trimethylolpropane tri(meth)acrylate, propylene oxide-modified trimethylolpropane tri(meth)acrylate, trimethyloletane tri(meth)acrylate, pentaerythritol di(meth)acrylate, pentaerythritol tri(meth)acrylate, pentaerythritol tetra(meth)acrylate, dipentaerythritol penta(meth)acrylate, dipentaerythritol hexa(meth)acrylate, tripentaerythritol octa(meth)acrylate, tripentaerythritol hepta (meth)acrylate, caprolactone-modified pentaerythritol tri (meth)acrylate, caprolactone-modified pentaerythritol tetra (meth)acrylate, caprolactone-modified dipentaerythritol hexa(meth)acrylate, epichlorohydrin-modified hexahydrophthalic acid di(meth)acrylate, hydroxypivalic acid neopentyl glycol di(meth)acrylate, neopentyl glycol di(meth) acrylate, ethylene oxide-modified neopentyl glycol di(meth) acrylate, propylene oxide-modified neopentyl glycol di(meth)acrylate, caprolactone-modified hydroxypivalic acid neopentyl glycol di(meth)acrylate, stearic acid-modified pentaerythritol di(meth)acrylate, epichlorohydrin-modified phthalic acid di(meth)acrylate, poly(ethylene glycol tetramethylene glycol) di(meth)acrylate, polypropylene glycol tetramethylene glycol) di(meth)acrylate, polyester (meth)acrylate, polyethylene glycol di(meth)acrylate, polyethylene glycol-polypropylene glycol-polyethylene glycol di(meth)acrylate, polypropylene glycol di(meth)acrylate, epichlorohydrin-modified propylene glycol di(meth)acrylate, propylene oxide-modified bisphenol A diglycidyl ether di(meth)acrylate, silicone di(meth)acrylate, triethylene glycol di(meth)acrylate, tetraethylene glycol di(meth)acrylate, tricyclodecane dimethanol di(meth)acrylate, neopentyl glycol-modified trimethylolpropane di(meth)acrylate, tripropylene glycol di(meth)acrylate, ethylene oxide-modified tripropylene glycol di(meth)acrylate, triglycerol di(meth) acrylate, dipropylene glycol di(meth)acrylate, epichlorohydrin-modified glycerol tri(meth)acrylate, ethylene oxide-modified glycerol tri(meth)acrylate, propylene oxide-modified glycerol tri(meth)acrylate, ethylene oxide-modified phosphoric acid tri(meth)acrylate, caprolactone-modified trimethylolpropane tri(meth)acrylate, HPA-modified trimethylolpropane tri(meth)acrylate, ethylene oxide-modified trimethylolpropane tri(meth)acrylate, propylene oxide-modified trimethylolpropane tri(meth)acrylate, trimethylolpropane benzoate (meth)acrylate, tris ((meth)acryloxyethyl) isocyanurate, alkoxy-modified trimethylolpropane tri(meth)acrylate, dipentaerythritol poly (meth)acrylate, alkyl-modified dipentaerythritol tri(meth) acrylate and ditrimethylolpropane tetra(meth)acrylate. One kind of these compounds may be used alone, or two or more kinds thereof may be used in combination.

Examples of the polyvalent mercapto compound include 1,2-dimercaptoethane, 1,3-dimercaptopropane, 1,4-dimercaptobutane, bisdimercaptoethanethiol (HS—CH$_2$CH$_2$—S—CH$_2$CH$_2$—SH), trimethylolpropane tri(mercaptoacetate), trimethylolpropane tri(mercaptopropionate), pentaerythritol tetra(mercaptoacetate), pentaerythritol tri(mercaptoacetate), pentaerythritol tetra(mercaptopropionate), dipentaerythritol hexa(mercaptoacetate) and dipentaerythritol hexa(mercaptopropionate). One kind of these compounds may be used alone, or two or more kinds thereof may be used in combination.

EXAMPLES

Examples will now be described below. First, materials used in the Examples and Comparative Examples will be described.

Electrically Conductive Particles (A) Whose Surfaces are Coated with Carbon Simple Substance and/or Carbon Compound (A-1) Silver particles having a primary particle size of 50 nm, and having a surface carbon coating layer with an average thickness of 1 nm (manufactured by Nisshin Engineering Inc.)

Alkali-Soluble Resin (B) Containing Acid-Dissociation Group (B-1)

Into a 500 mL flask, 2 g of 2,2'-azobis(isobutyronitrile) and 50 g of PGMEA were introduced. Thereafter, 15.69 g of methacrylic acid, 37.45 g of styrene, and 46.86 g of dicyclopentanyl methacrylate were introduced into the flask, followed by stirring at room temperature for a while. After sufficiently replacing the interior of the flask with nitrogen by bubbling, the flask was stirred for five hours while heating at 70° C. Subsequently, 10.46 g of glycidyl methacrylate, 1 g of dimethylbenzylamine, 0.2 g of p-methoxyphenol, and 100 g of PGMEA were added to the resulting solution, followed by stirring for four hours while heating at 90° C., to obtain a solution of an acrylic resin (B-1). To the thus obtained solution of the acrylic resin (B-1), PGMEA was added to achieve a solid concentration of 40% by mass. The acrylic resin (B-1) had a weight average molecular weight (Mw) of 25,000.

(B-2)

Into a 500 mL flask, 2 g of 2,2'-azobis(isobutyronitrile) and 50 g of PGMEA (propylene glycol methyl ether acetate) were introduced. Thereafter, 23.26 g of methacrylic acid, 31.46 g of benzyl methacrylate, and 32.80 g of dicyclopentanyl methacrylate were introduced into the flask, followed by stirring at room temperature for a while. After sufficiently replacing the interior of the flask with nitrogen by bubbling, the flask was stirred for five hours while heating at 70° C. Subsequently, 12.69 g of glycidyl methacrylate, 1 g of dimethylbenzylamine, 0.2 g of p-methoxyphenol, and 100 g of PGMEA were added to the resulting solution, followed by stirring for four hours while heating at 90° C., to obtain a solution of the acrylic resin (B-2). To the thus obtained solution of the acrylic resin (B-2), PGMEA was added to achieve a solid concentration of 40% by mass. The acrylic resin (B-2) had a weight average molecular weight (Mw) of 24,000.

Metal Chelate Compound (C)

(C-1) ALCH: ethyl acetoacetate aluminum diisopropylate (manufactured by Kawaken Fine Chemicals Co., Ltd.)

(C-2) ALCH-TR: aluminum tris(ethylacetoacetate) (manufactured by Kawaken Fine Chemicals Co., Ltd.)

(C-3) Aluminum chelate M: alkyl acetoacetate aluminum diisopropylate (manufactured by Kawaken Fine Chemicals Co., Ltd.)

(C-4) Aluminum chelate D: aluminum monoacetylacetonate bis(ethylacetoacetate) (manufactured by Kawaken Fine Chemicals Co., Ltd.)

(C-5) Aluminum chelate A (W): aluminum tris(acetylacetonate) (manufactured by Kawaken Fine Chemicals Co., Ltd.)

(C-6) ZC-150: zirconium tetra(acetylacetonate) (manufactured by Matsumoto Fine Chemical Co. Ltd.)

(C-7) ZC-540: zirconium tributoxy monoacetylacetonate (manufactured by Matsumoto Fine Chemical Co. Ltd.)

(C-8) Neostann U-600: bismuth trioctate/2-ethylhexanoic acid (manufactured by Nitto Kasei Co., Ltd.)

Dispersant

DISPERBYK (registered trademark) 21116 (manufactured by BYK Japan KK)

Solvent

PGMEA: propylene glycol monomethyl ether acetate (manufactured by Sankyo Chemical Co., Ltd.)

DPM: dipropylene glycol monomethyl ether (manufactured by TOHO Chemical Industry Co., Ltd.)

Photopolymerization Initiator

NCI-831 (registered trademark) (an oxime ester compound; manufactured by ADEKA Corporation)

Acrylic Monomer

Light Acrylate (registered trademark) PE-3A (manufactured by Kyoeisha Chemical Co., Ltd.)

Film Containing Organic Component (X-1)

Into a 500 ml flask, 1 g of AIBN and 50 g of PGMEA were introduced. Thereafter, 38.6 g of methacrylic acid, 16.4 g of methyl methacrylate, and 16.4 g of styrene were introduced into the flask, followed by stirring at room temperature for a while. After sufficiently replacing the interior of the flask with nitrogen by bubbling, the flask was stirred for five hours while heating at 70° C. Subsequently, 28.6 g of glycidyl methacrylate, 1 g of dimethylbenzylamine, 0.2 g of p-methoxyphenol, and 100 g of PGMEA were added to the resulting solution, followed by stirring for four hours while heating at 90° C., to obtain a solution of an acrylic polymer. The thus obtained acrylic polymer had a weight average molecular weight (Mw) of 29,000. Under yellow light, 0.25 g of OXE-02, 0.50 g of LA-87, and 0.50 g of TBC prepared as a 10 wt % PGMEA solution were dissolved in 14.19 g of PGMEA and 30.00 g of DAA. To the resultant, 0.30 g of BYK-333 prepared as a 10 wt % PGMEA solution (corresponds to a concentration of 300 ppm) was added, followed by stirring. To the resulting solution, 6.49 g of TEPIC-VL prepared as a 50 wt % PGMEA solution, 12.49 g of EG-200 prepared as a 20 wt % PGMEA solution, 6.19 g of DPHA, 9.36 g of the acrylic polymer obtained above, 18.73 g of "V-259ME (brand name)" (manufactured by Nippon Steel & Sumikin Chemical Co., Ltd.), and 1.00 g of KBM-403 were added, followed by stirring. Subsequently, the resultant was filtered with a 0.45 μm filter, to obtain a composition (X-1).

(X-2)

A quantity of 40 g of cyclohexanone was added to 10 g of "SUMIKAEXCEL PES 4100P (brand name)" (manufactured by Sumitomo Chemical Company, Limited), followed by stirring. In this manner, a composition (X-2) having a solid concentration of 20 wt % was obtained.

(X-3)

Under dry nitrogen gas flow, 29.3 g (0.08 mol) of 2,2-bis(3-amino-4-hydroxyphenyl)hexafluoropropane (BAHF; manufactured by Central Glass Co., Ltd.), 1.24 g (0.005 mol) of 1,3-bis(3-aminopropyl)tetramethyldisiloxane, and 3.27 g (0.03 mol) of 3-aminophenol as a terminal blocking agent were dissolved in 150 g of N-methyl-2-pyrrolidone (NMP). To the resulting solution, 31.0 g (0.1 mol) of 3,3',4,4'-diphenyl ether tetracarboxylic acid dianhydride (ODPA; manufactured by Manac Incorporated.) was added, along with 50 g of NMP, and the resultant was stirred at 20° C. for one hour, followed by stirring at 50° C. for four hours. Thereafter, 15 g of xylene was added, and the resultant stirred at 150° C. for five hours, while azeotroping water with xylene. After completion of the stirring, the resulting solution was introduced into 3 L of water, and white precipitates formed were collected. The resulting precipitates were collected by filtration, washed with water three times, and then dried in a vacuum dryer at 80° C. for 24 hours, to obtain a polyimide polymer. To 7.5 g of the thus obtained polyimide polymer, 42.5 g of GBL was added, followed by stirring. In this manner, a composition (X-3) having a solid concentration of 15 wt % was obtained.

(X-4)

Under yellow light, 0.25 g of "PBG-305 (brand name)" (manufactured by Changzhou Tronly New Electronic Materials Co., Ltd.), 0.50 g of "LA-87 (brand name)" (manufactured by ADEKA Corporation), and 0.50 g of TBC prepared as a 10 wt % PGMEA solution were dissolved in 2.24 g of PGMEA and 30.00 g of DAA. To the resultant, 0.30 g of BYK-333 prepared as a 10 wt % PGMEA solution (corresponds to a concentration of 300 ppm) was added, followed by stirring. To the resulting solution, 4.25 g of "TAIC (brand name)" (manufactured by Nippon Kasei Chemical Co., Ltd.), 24.50 g of "OGSOL PG-100 (brand name)" (manufactured by Osaka Gas Chemicals Co., Ltd.) prepared as a 10 wt % PGMEA solution, 1.25 g of "OGSOL EA-0250P (brand name)" (manufactured by Osaka Gas Chemicals Co., Ltd.), 2.75 g of "M-315 (brand name)" (manufactured by Kyoeisha Chemical Co., Ltd.), 3.12 g of "SIRIUS-501 (brand name)" (manufactured by Osaka Organic Chemical Industry Ltd.), 29.34 g of "V-259ME (brand name)" (manufactured by Nippon Steel & Sumikin Chemical Co., Ltd.), and 1.00 g of "KBM-403 (brand name)" (manufactured by Shin-Etsu Chemical Co., Ltd. were added, followed by stirring. Subsequently, the resultant was filtered with a 0.45 µm filter, to obtain a composition (X-4).

Preparation of Film Containing Organic Component (Y-1)

The composition (X-1) was spin coated on a non-alkali glass base material (OA-10G; manufactured by Nippon Electric Glass Co. Ltd.) using a spin coater ("1H-360S (brand name)"; manufactured by Mikasa Co., Ltd.) at 650 rpm for five seconds. The coated base material was pre-baked at 100° C. for two minutes using a hot plate ("SCW-636 (brand name)"; manufactured by Dainippon Screen Mfg. Co., Ltd.), to obtain a pre-baked film having a film thickness of 2.5 µm. The pre-baked film was exposed through a desired mask, using a parallel light mask aligner ("PLA-501F (brand name)"; manufactured by Canon Inc.), with an ultra-high pressure mercury lamp as a light source. Thereafter, shower development with a 0.045 wt % aqueous solution of potassium hydroxide was carried out for 60 seconds, using an automatic developing apparatus ("AD-2000 (brand name)"; manufactured by Takizawa Co., Ltd.), followed by rinsing with water for 30 seconds, to carry out patterning. Subsequently, an oven ("IHPS-222"; manufactured by ESPEC Corp.) was used to carry out post-baking at 230° C. for 30 minutes (in the air), to prepare a film (Y-1) containing an organic component.

(Y-2)

The composition (X-2) was spin coated on a non-alkali glass base material (OA-10G; manufactured by Nippon Electric Glass Co. Ltd.) using a spin coater ("1H-360S (brand name)"; manufactured by Mikasa Co., Ltd.) at 650 rpm for five seconds. The coated base material was pre-baked at 100° C. for two minutes using a hot plate ("SCW-636 (brand name)"; manufactured by Dainippon Screen Mfg. Co., Ltd.), to obtain a pre-baked film having a film thickness of 2.5 µm. Subsequently, an oven ("IHPS-222"; manufactured by ESPEC Corp.) was used to carry out post-baking at 230° C. for 30 minutes (in the air), to prepare a film (Y-2) containing an organic component.

(Y-3)

The same procedure as that in the method of preparing the film (Y-2) was repeated, to produce a film (Y-3) containing an organic component, using the composition (X-3).

(Y-4)

The same procedure as that in the method of preparing the film (Y-1) was repeated, to produce a film (Y-4) containing an organic component, using the composition (X-4).

Evaluation of Patternability

Using a non-alkali glass base material (OA-10; manufactured by Nippon Electric Glass Co. Ltd.), or a base material coated with any of the films (Y-1) to (Y-4), evaluation of the patternability of each of the photosensitive resin compositions was carried out. The film thickness after pre-baking was set to 2.5 and a gray scale mask to measure sensitivity was used to carry out the exposure. After the completion of the development, the amount of light exposure required to form a line and space pattern of 30 µm at a width ratio of 1:1 (hereinafter, this amount of light exposure is referred to as "optimum light exposure dose") was defined as the sensitivity, and the size of the smallest pattern after being developed at the optimum light exposure dose was defined as the resolution.

The resolution is preferably 5 µm or less, and more preferably 2 µm or less.

Evaluation of Electrical Conductivity

Using a non-alkali glass base material (OA-10; manufactured by Nippon Electric Glass Co. Ltd.), or a base material coated with any of the films (Y-1) to (Y-4), an electrically conductive pattern to evaluate the volume resistivity of the composition was prepared. The film thickness after pre-baking was set to 0.6 µm, and exposure was carried out through a photomask having a rectangular translucent pattern (10 mm×15 mm).

The resulting pattern to evaluate the volume resistivity was subjected to the measurement of the surface resistance value: ρs (Ω/□) using a surface resistance measuring device ("Loresta (registered trademark) -FP"; manufactured by Mitsubishi Petrochemical Co., Ltd.), and the measurement of the film thickness: t (cm) using a surface texture and contour measuring instrument ("SURFCOM (registered trademark) 1400D"; manufactured by Tokyo Seimitsu Co., Ltd.). Both the values determined by the above measurements were multiplied with each other, to calculate the volume resistivity (µΩ·cm). The volume resistivity is preferably less than 100 µΩ·cm, and more preferably less than 65 µΩ·cm.

Evaluation of Residues on Substrate

The evaluation of residues on each substrate was carried out, by evaluating the transmittance of the unexposed portions of the substrate on which the above described pattern to evaluate the volume resistivity was formed. Specifically, the transmittance at 400 nm of the unexposed portion of the substrate was measured before and after the film formation, using a UV-visible spectrophotometer ("Multi Spec-1500 (brand name)"; manufactured by Shimadzu Corporation). Then the change in the transmittance, which is represented by the formula: (T0−T)/T0 (wherein T0 represents the transmittance before the film formation, and T represents the transmittance after the film formation) was calculated. The change in the transmittance is preferably less than 1.0%, and more preferably less than 0.7%.

Example 1

First, 80.00 g of the electrically conductive particles (A-1) whose surfaces are coated with a carbon simple substance and/or a carbon compound, 6.25 g of DISPERBYK 21116, 146.25 g of PGMEA, and 150.00 g of DPM were mixed using a homogenizer at 1,200 rpm for 30 minutes. Further, the resulting mixture was dispersed using a high-pressure, wet-type, medialess pulverizer, NANOMIZER (manufactured by Nanomizer Inc.), to obtain a dispersion of silver particles. To 382.50 g of the thus obtained dispersion of silver fine particles, 10.00 g of the alkali-soluble resin (B) containing an acid-dissociation group, 0.3 g of the metal chelate compound (C-1), 1.20 g of NCI-831, and 6.00 g of PE-3A were mixed. To the resulting mixture, 50.00 g of PGMEA and 50.00 g of DPM were added, followed by stirring, to obtain a photosensitive resin composition 1.

The thus obtained photosensitive resin composition 1 was spin coated on the film (Y-1) containing an organic component, using a spin coater ("1H-360S (brand name)"; manufactured by Mikasa Co., Ltd.) at 300 rpm for 10 seconds, and then at 500 rpm for two seconds. The coated base material was pre-baked at 100° C. for two minutes using a hot plate ("SCW-636 (brand name)"; manufactured by Dainippon Screen Mfg. Co., Ltd.), to obtain a pre-baked film having a film thickness of 1 The pre-baked film was exposed through a desired mask, using a parallel light mask aligner ("PLA- 501F (brand name)"; manufactured by Canon Inc.), with an ultra-high pressure mercury lamp as a light source. Thereafter, shower development with a 0.045 wt % aqueous solution of potassium hydroxide was carried out for 60 seconds, using an automatic developing apparatus ("AD-2000 (brand name)"; manufactured by Takizawa Co., Ltd.), followed by rinsing with water for 30 seconds, to carry out patterning. After completion of the exposure and development, the amount of light exposure required for forming a line and space pattern of 5 μm at a width ratio of 1:1 (hereinafter, this amount of light exposure is referred to as "optimum light exposure dose") was measured and defined as the sensitivity. The light exposure was measured using an i-ray illuminometer. Then, the size of the smallest pattern after being developed at the optimum light exposure dose was measured and defined as the resolution.

Further, the photosensitive resin composition 1 was separately spin coated on the film (Y-1) containing an organic component, using a spin coater ("1H-360S (brand name)"; manufactured by Mikasa Co., Ltd.) at 300 rpm for 10 seconds, and then at 500 rpm for two seconds. The coated base material was pre-baked at 100° C. for two minutes using a hot plate ("SCW-636 (brand name)"; manufactured by Dainippon Screen Mfg. Co., Ltd.), to obtain a pre-baked film having a film thickness of 1 The pre-baked film was exposed through a desired mask, using a parallel light mask aligner ("PLA-501F (brand name)"; manufactured by Canon Inc.), with an ultra-high pressure mercury lamp as a light source. Thereafter, shower development with a 0.045 wt % aqueous solution of potassium hydroxide was carried out for 60 seconds, using an automatic developing apparatus ("AD-2000 (brand name)"; manufactured by Takizawa Co., Ltd.), followed by rinsing with water for 30 seconds, to carry out patterning. Subsequently, an oven ("IHPS-222"; manufactured by ESPEC Corp.) was used to carry out post-baking at 230° C. for 30 minutes (in the air), to prepare a pattern for evaluating the volume resistivity.

The resulting pattern to evaluate the volume resistivity was subjected to the measurement of the surface resistance value: ρs (Ω/□) using a surface resistance measuring device (Loresta (registered trademark) -FP; manufactured by Mitsubishi Petrochemical Co., Ltd.), and the measurement of the film thickness: t (cm) using a surface texture and contour measuring instrument (SURFCOM (registered trademark) 1400D; manufactured by Tokyo Seimitsu Co., Ltd.). Both the values determined by the above measurements were multiplied with each other, to calculate the volume resistivity (μΩ·cm).

Further, the evaluation of residues on the substrate was carried out, by evaluating the transmittance of the unexposed portions of the substrate on which the above described pattern to evaluate the volume resistivity was formed. Specifically, the transmittance at 400 nm of the unexposed portion of the substrate was measured before and after the film formation, using a spectrophotometer (U-3410; manufactured by Hitachi Ltd.). Then the change in the transmittance, which is represented by formula: (T0−T)/T0 (wherein T0 represents the transmittance before the film formation, and T represents the transmittance after the film formation) was calculated. When the change in the transmittance is less than 1%, it can be determined that the effect of suppressing residues is sufficiently obtained. The results of the measured resolution, and the calculated volume resistivity and the change in the transmittance, are shown in Table 1.

Examples 2 to 21 and Comparative Examples 1 to 11

The same procedure as in Example 1 was repeated to prepare photosensitive resin compositions having the compositions shown in Table 1. The evaluations of the respective photosensitive resin compositions were carried out in the same manner as in Example 1, using the respective base materials shown in Tables 1 to 3. The evaluation results are shown in Tables 1 to 3. Further, as each of the glass base materials shown in the Tables, a non-alkali glass base material (OA-10G; manufactured by Nippon Electric Glass Co. Ltd.) was used.

TABLE 1

| | | Example 1 | Example 2 | Example 3 | Example 4 | Example 5 | Example 6 |
|---|---|---|---|---|---|---|---|
| Composition | Electrically conductive particles (A) whose surfaces are coated with a carbon simple substance and/or a carbon compound [g] | A-1 80.0 | A-1 80.0 | A-1 80.0 | A-1 80.0 | A-1 80.0 | A-1 80.0 |
| | Alkali-soluble resin (B) containing an acid-dissociation group [g] | B-2 10.0 | B-2 10.0 | B-2 10.0 | B-2 10.0 | B-2 10.0 | B-2 10.0 |
| | Metal chelate compound (C) [g] | C-1 0.3 | C-1 0.3 | C-2 0.3 | C-2 0.3 | C-2 0.3 | C-2 0.3 |
| | Photopolymerization Initiator [g] | 1.2 | 1.2 | 1.2 | 1.2 | 1.2 | 1.2 |
| | Acrylic monomer [g] | 6.0 | 6.0 | 6.0 | 6.0 | 6.0 | 6.0 |
| | Dispersant [g] | 2.5 | 2.5 | 2.5 | 2.5 | 2.5 | 2.5 |
| | Total Solid Content [g] | 100.0 | 100.0 | 100.0 | 100.0 | 100.0 | 100.0 |
| | Solid content ratio [% by mass] | 20 | 20 | 20 | 20 | 20 | 20 |
| | Base material | Y-1 | Y-4 | Glass | Y-1 | Y-2 | Y-3 |
| Evaluation Results | Patternability Resolution L/S (μm) | 2.0 | 2.0 | 2.0 | 2.0 | 2.0 | 2.0 |
| | Electrical conductivity Volume resistivity (μΩ·cm) | 62 | 55 | 50 | 55 | 53 | 55 |
| | Residues on substrate Change in transmittance (400 nm) | 0.2% | 0.2% | 0.1% | 0.2% | 0.3% | 0.3% |

| | | Example 7 | Example 8 | Example 9 | Example 10 | Example 11 |
|---|---|---|---|---|---|---|
| Composition | Electrically conductive particles (A) whose surfaces are coated with a carbon simple substance and/or a carbon compound [g] | A-1 80.0 | A-1 80.0 | A-1 80.0 | A-1 80.0 | A-1 80.0 |

TABLE 1-continued

|  |  |  |  |  |  |  |
|---|---|---|---|---|---|---|
| Alkali-soluble resin (B) containing an acid-dissociation group [g] | | B-2 10.0 | B-2 10.0 | B-2 10.0 | B-2 10.0 | B-2 10.0 |
| Metal chelate compound (C) [g] | | C-2 0.3 | C-3 0.3 | C-4 0.3 | C-4 0.3 | C-4 0.3 |
| Photopolymerization Initiator [g] | | 1.2 | 1.2 | 1.2 | 1.2 | 1.2 |
| Acrylic monomer [g] | | 6.0 | 6.0 | 6.0 | 6.0 | 6.0 |
| Dispersant [g] | | 2.5 | 2.5 | 2.5 | 2.5 | 2.5 |
| Total Solid Content [g] | | 100.0 | 100.0 | 100.0 | 100.0 | 100.0 |
| Solid content ratio [% by mass] | | 20 | 20 | 20 | 20 | 20 |
| Base material | | Y-4 | Y-4 | Glass | Y-1 | Y-2 |
| Evaluation Results | Patternability | Resolution L/S (μm) | 2.0 | 2.0 | 2.0 | 2.0 | 2.0 |
| | Electrical conductivity | Volume resistivity (μΩ·cm) | 52 | 55 | 51 | 55 | 52 |
| | Residues on substrate | Change in transmittance (400 nm) | 0.1% | 0.2% | 0.1% | 0.2% | 0.5% |

TABLE 2

|  |  |  | Example 12 | Example 13 | Example 14 | Example 15 | Example 16 |
|---|---|---|---|---|---|---|---|
| Composition | Electrically conductive particles (A) whose surfaces are coated with a carbon simple substance and/or a carbon compound [g] | | A-1 80.0 | A-1 80.0 | A-1 80.0 | A-1 80.0 | A-1 80.0 |
| | Alkali-soluble resin (B) containing an acid-dissociation group [g] | | B-2 10.0 | B-2 10.0 | B-2 10.0 | B-2 10.0 | B-2 10.0 |
| | Metal chelate compound (C) [g] | | C-4 0.3 | C-4 0.3 | C-5 0.3 | C-5 0.3 | C-5 0.3 |
| | Photopolymerization Initiator [g] | | 1.2 | 1.2 | 1.2 | 1.2 | 1.2 |
| | Acrylic monomer [g] | | 6.0 | 6.0 | 6.0 | 6.0 | 6.0 |
| | Dispersant [g] | | 2.5 | 2.5 | 2.5 | 2.5 | 2.5 |
| | Total Solid Content [g] | | 100.0 | 100.0 | 100.0 | 100.0 | 100.0 |
| | Solid content ratio [% by mass] | | 20 | 20 | 20 | 20 | 20 |
| | Base material | | Y-3 | Y-4 | Glass | Y-1 | Y-2 |
| Evaluation Results | Patternability | Resolution L/S (μm) | 2.0 | 2.0 | 2.0 | 2.0 | 2.0 |
| | Electrical conductivity | Volume resistivity (μΩ·cm) | 55 | 52 | 51 | 54 | 53 |
| | Residues on substrate | Change in transmittance (400 nm) | 0.6% | 0.2% | 0.1% | 0.2% | 0.4% |

|  |  |  | Example 17 | Example 18 | Example 19 | Example 20 | Example 21 |
|---|---|---|---|---|---|---|---|
| Composition | Electrically conductive particles (A) whose surfaces are coated with a carbon simple substance and/or a carbon compound [g] | | A-1 80.0 | A-1 80.0 | A-1 80.0 | A-1 80.0 | A-1 80.0 |
| | Alkali-soluble resin (B) containing an acid-dissociation group [g] | | B-2 10.0 | B-2 10.0 | B-2 10.0 | B-2 10.0 | B-2 10.0 |
| | Metal chelate compound (C) [g] | | C-5 0.3 | C-5 0.3 | C-6 0.3 | C-7 0.3 | C-8 0.3 |
| | Photopolymerization Initiator [g] | | 1.2 | 1.2 | 1.2 | 1.2 | 1.2 |
| | Acrylic monomer [g] | | 6.0 | 6.0 | 6.0 | 6.0 | 6.0 |
| | Dispersant [g] | | 2.5 | 2.5 | 2.5 | 2.5 | 2.5 |
| | Total Solid Content [g] | | 100.0 | 100.0 | 100.0 | 100.0 | 100.0 |
| | Solid content ratio [% by mass] | | 20 | 20 | 20 | 20 | 20 |
| | Base material | | Y-3 | Y-4 | Y-4 | Y-4 | Y-4 |
| Evaluation Results | Patternability | Resolution L/S (μm) | 2.0 | 2.0 | 2.0 | 2.0 | 2.0 |
| | Electrical conductivity | Volume resistivity (μΩ·cm) | 55 | 51 | 52 | 52 | 53 |
| | Residues on substrate | Change in transmittance (400 nm) | 0.5% | 0.2% | 0.2% | 0.2% | 0.2% |

TABLE 3

| | | Comparative Example 1 | Comparative Example 2 | Comparative Example 3 | Comparative Example 4 | Comparative Example 5 | Comparative Example 6 |
|---|---|---|---|---|---|---|---|
| Composition | Electrically conductive particles (A) whose surfaces are coated with a carbon simple substance and/or a carbon compound [g] | A-1 80.0 | A-1 80.0 | A-1 80.0 | A-1 80.0 | A-1 80.0 | A-1 80.0 |
| | Alkali-soluble resin (B) containing an acid-dissociation group [g] | B-1 10.0 | B-1 10.0 | B-1 10.0 | B-1 10.0 | B-1 10.0 | B-1 10.0 |
| | Metal chelate compound (C) [g] | C-1 0.3 | C-2 0.3 | C-3 0.3 | C-4 0.3 | C-5 0.3 | C-6 0.3 |
| | Photopolymerization Initiator [g] | 1.2 | 1.2 | 1.2 | 1.2 | 1.2 | 1.2 |
| | Acrylic monomer [g] | 6.0 | 6.0 | 6.0 | 6.0 | 6.0 | 6.0 |
| | Dispersant [g] | 2.5 | 2.5 | 2.5 | 2.5 | 2.5 | 2.5 |
| | Total Solid Content [g] | 100.0 | 100.0 | 100.0 | 100.0 | 100.0 | 100.0 |
| | Solid content ratio [% by mass] | 20 | 20 | 20 | 20 | 20 | 20 |
| | Base material | Y-1 | Y-1 | Y-1 | Y-1 | Y-1 | Y-1 |
| Evaluation results | Patternability Resolution L/S (μm) | 2.5 | 3.0 | 3.0 | 4.0 | 2.5 | 2.5 |
| | Electrical conductivity Volume resistivity (μΩ·cm) | 60 | 67 | 63 | 60 | 63 | 62 |
| | Residues on substrate Change in transmittance (400 nm) | 0.2% | 0.5% | 0.4% | 0.7% | 0.3% | 0.6% |

| | | Comparative Example 7 | Comparative Example 8 | Comparative Example 9 | Comparative Example 10 | Comparative Example 11 |
|---|---|---|---|---|---|---|
| Composition | Electrically conductive particles (A) whose surfaces are coated with a carbon simple substance and/or a carbon compound [g] | A-1 80.0 | A-1 80.0 | A-1 80.0 | A-1 80.0 | A-1 80.0 |
| | Alkali-soluble resin (B) containing an acid-dissociation group [g] | B-1 10.0 | B-1 10.0 | B-1 10.0 | B-1 10.3 | B-2 10.3 |
| | Metal chelate compound (C) [g] | C-7 0.3 | C-1 0.3 | C-1 0.3 | — | — |
| | Photopolymerization Initiator [g] | 1.2 | 1.2 | 1.2 | 1.2 | 1.2 |
| | Acrylic monomer [g] | 6.0 | 6.0 | 6.0 | 6.0 | 6.0 |
| | Dispersant [g] | 2.5 | 2.5 | 2.5 | 2.5 | 2.5 |
| | Total Solid Content [g] | 100.0 | 100.0 | 100.0 | 100.0 | 100.0 |
| | Solid content ratio [% by mass] | 20 | 20 | 20 | 20 | 20 |
| | Base material | Y-1 | Y-2 | Y-3 | Y-1 | Y-1 |
| Evaluation results | Patternability Resolution L/S (μm) | 4.0 | 5.0 | 4.5 | 4.0 | 3.5 |
| | Electrical conductivity Volume resistivity (μΩ·cm) | 60 | 60 | 62 | 62 | 57 |
| | Residues on substrate Change in transmittance (400 nm) | 0.2% | 0.7% | 0.4% | 3.5% | 3.8% |

Each of the photosensitive resin compositions of Examples 1 to 21 exhibited a sufficient effect of suppressing residues due to the addition of the metal chelate compound, and achieved a resolution of less than 2 μm or less.

On the other hand, each of the photosensitive resin compositions of Comparative Examples 1 to 9 resulted in an insufficient formation of a fine pattern due to containing the alkali-soluble resin that does not contain an acid-dissociation group. Further, each of the photosensitive resin compositions of Comparative Examples 10 and 11 failed to exhibit a sufficient effect of suppressing residues because the metal chelate compound was not added thereto.

INDUSTRIAL APPLICABILITY

Our photosensitive resin composition can be suitably used to form an electrically conductive pattern used in a touch panel, a display, an image sensor, an organic electroluminescent lighting device, a solar cell or the like.

The invention claimed is:

1. A photosensitive resin composition comprising:
   electrically conductive particles (A) whose surfaces are coated with a carbon simple substance and/or a carbon compound;
   an alkali-soluble resin (B) containing an acid-dissociation group; and
   a metal chelate compound (C),
   wherein the alkali-soluble resin (B) is a (meth)acrylic acid ester, and said acid-dissociation group is selected from the group consisting of tert-butyl group, tert-butoxycarbonyl group, benzyl group, methyladamantyl group and tetrahydropyranyl group.

2. The photosensitive resin composition according to claim 1, wherein the metal chelate compound (C) comprises at least one selected from the group consisting of Au, Ag, Cu, Cr, Fe, Co, Ni, Bi, Pb, Zn, Pd, Pt, Al, Ti, Zr, W and Mo.

3. The photosensitive resin composition according to claim 1, wherein the metal chelate compound (C) comprises at least one of Al, Zr and Bi.

4. The photosensitive resin composition according to claim 1, wherein the metal chelate compound (C) comprises two or more ligands.

5. The photosensitive resin composition according to claim 1, wherein the electrically conductive particles (A) comprise silver.

6. The photosensitive resin composition according to claim 1, wherein the electrically conductive particles (A) have a primary particle size of 1 to 700 nm.

7. A method of producing an electrically conductive pattern, the method comprising:
   coating the photosensitive resin composition according to claim 1 on a base material, to obtain a coating film;
   drying the coating film to obtain a dried film;
   exposing and developing the dried film to form a pattern; and
   post-baking the pattern to obtain the electrically conductive pattern.

8. The method according to claim 7, wherein the electrically conductive pattern has a width of 5 μm or less.

9. A substrate comprising an electrically conductive pattern composed of a cured product of the photosensitive resin composition according to claim 1.

10. The substrate according to claim 9, comprising a film containing an organic component; and the electrically conductive pattern formed on the film.

11. The substrate according to claim 10, comprising, in order from a side of the base material: the electrically conductive pattern; the film containing an organic component; and a laminate of electrically conductive patterns.

12. The substrate according to claim 10, wherein the film containing an organic component contains an alkali-soluble resin.

13. The substrate according to claim 12, wherein the alkali-soluble resin in the film containing an organic component contains a polar group.

14. The substrate according to claim 12, wherein the alkali-soluble resin in the film containing an organic component contains a cardo type resin.

15. The substrate according to claim 14, wherein the alkali-soluble resin in the film containing an organic component further contains an acrylic resin, and the content ratio (in weight ratio) of the cardo type resin to the acrylic resin is 1:10 to 10:1.

16. The substrate according to claim 10, wherein the film containing an organic component contains at least one of a polyimide resin, a polyimide-siloxane resin, a polyether sulfone resin, a polybenzoxazole resin, an aramid resin, an epoxy resin and a sulfonamide resin.

17. The substrate according to claim 16, wherein the film containing an organic component contains at least one of a polyimide resin, a polyimide-siloxane resin, a polybenzoxazole resin and an aramid resin.

18. A method of producing a touch panel, comprising:
   coating the photosensitive resin composition according to claim 1 on a base material;
   drying the coated composition to obtain a film; and
   exposing and developing the resulting film.

19. A method of producing a display, comprising developing the photosensitive resin composition according to claim 1.

20. A method of producing an image sensor, comprising developing the photosensitive resin composition according to claim 1.

21. A method of producing an organic electroluminescent lighting device, comprising developing the photosensitive resin composition according to claim 1.

22. A method of producing a solar cell, comprising developing the photosensitive resin composition according to claim 1.

* * * * *